(12) United States Patent
Lee

(10) Patent No.: US 11,749,147 B2
(45) Date of Patent: Sep. 5, 2023

(54) METHOD FOR TESTING TOUCH DISPLAY PANEL

(71) Applicant: HannStar Display Corporation, Taipei (TW)

(72) Inventor: Ya-Wen Lee, Tainan (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 17/448,896

(22) Filed: Sep. 27, 2021

(65) Prior Publication Data

US 2022/0101765 A1 Mar. 31, 2022

(30) Foreign Application Priority Data

Sep. 30, 2020 (CN) .......................... 202011059911.3

(51) Int. Cl.
*G09G 3/00* (2006.01)
*G06F 3/041* (2006.01)
*G09G 3/36* (2006.01)
*G02F 1/1333* (2006.01)

(52) U.S. Cl.
CPC ............ *G09G 3/006* (2013.01); *G06F 3/0412* (2013.01); *G06F 3/04184* (2019.05); *G09G 3/3614* (2013.01); *G02F 1/13338* (2013.01); *G09G 2300/0443* (2013.01); *G09G 2300/0809* (2013.01); *G09G 2330/12* (2013.01)

(58) Field of Classification Search
CPC .... G09G 3/006; G09G 3/3614; G09G 3/2022; G09G 3/3674; G09G 2300/0443; G09G 2300/0809; G09G 2310/0267; G09G 2310/0286; G09G 2330/12; G06F 3/0412; G06F 3/04184; G06F 3/04166; G06F 3/0446; G02F 1/13338; H01L 27/323; H01L 51/0031
See application file for complete search history.

(56) References Cited

U.S. PATENT DOCUMENTS

| 2004/0183768 | A1* | 9/2004 | Yamato | ................. G09G 3/3614 345/98 |
| 2010/0097366 | A1* | 4/2010 | Kitayama | ............ G09G 3/2077 345/94 |
| 2016/0026044 | A1* | 1/2016 | Nam | ................. H01L 29/66969 438/30 |
| 2016/0259475 | A1* | 9/2016 | Nakamura | .......... G06F 3/04184 |

(Continued)

*Primary Examiner* — David Tung
(74) *Attorney, Agent, or Firm* — CKC & Partners Co., LLC

(57) ABSTRACT

A method for testing a touch display panel includes: dividing a frame period of the image into a first subframe period and a second subframe period; transmitting pixel data to some subpixels corresponding to a touch sensing electrode in the first subframe period; and transmitting pixel data to the other subpixels corresponding to the touch sensing electrode in the second subframe period. The number of the subpixels receiving pixel data of positive polarity in the some subpixels subtracted by the number of the subpixels receiving pixel data of negative polarity in the some subpixels is defined as a first value, the number of the subpixels receiving pixel data of positive polarity in the other subpixels subtracted by the number of the subpixels receiving pixel data of negative polarity in the other subpixels is defined as a second value, and a sum of the first and second values is 0.

9 Claims, 25 Drawing Sheets

(56) References Cited

U.S. PATENT DOCUMENTS

| | | | |
|---|---|---|---|
| 2018/0150162 A1* | 5/2018 | Kim | G06F 11/2221 |
| 2018/0329544 A1* | 11/2018 | Yeh | G06F 3/04164 |
| 2019/0155436 A1* | 5/2019 | Jin | G06F 3/0416 |
| 2021/0126017 A1* | 4/2021 | Furuta | H01L 27/124 |
| 2022/0013074 A1* | 1/2022 | Hayashi | G02F 1/13439 |

* cited by examiner

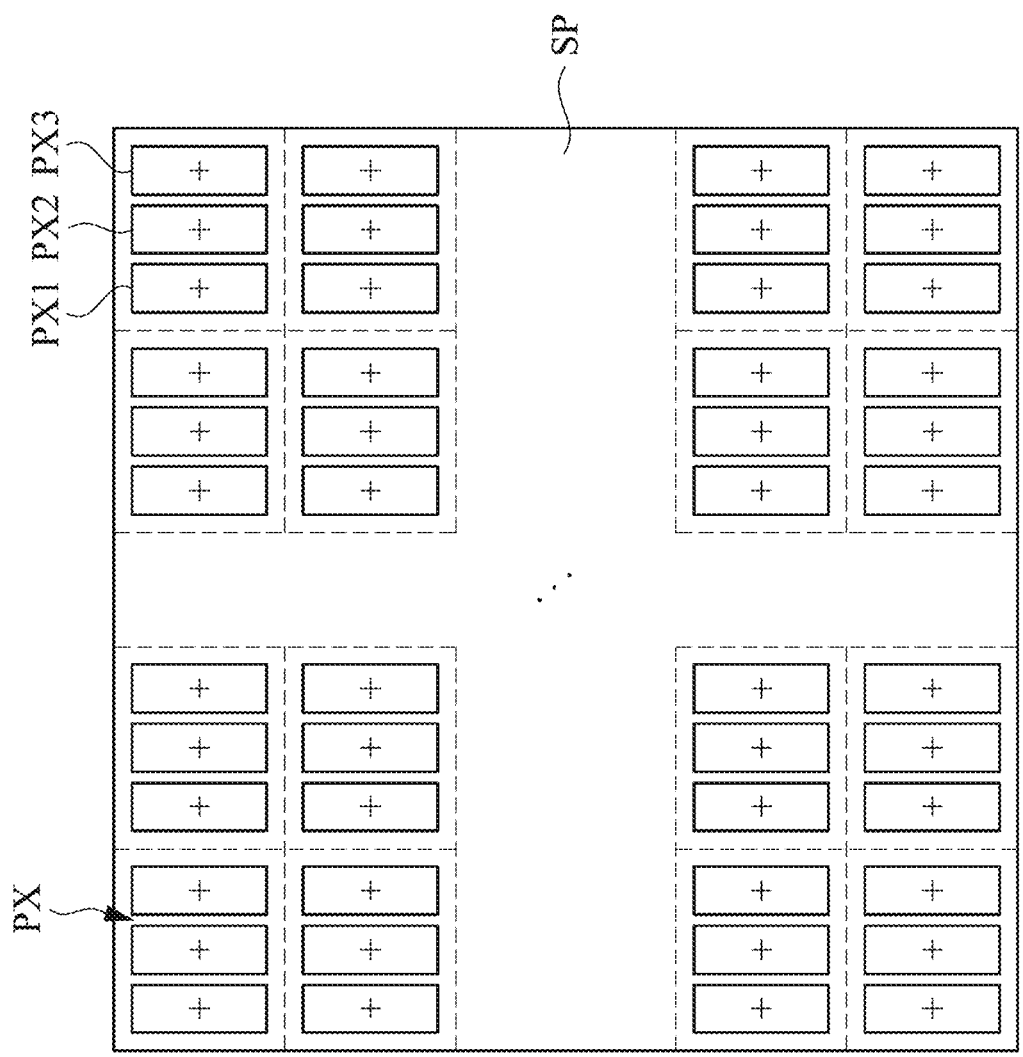

| | | | | FP1 | | | |
|---|---|---|---|---|---|---|---|
| Experiment | DLA | DLB | DLC | Number of positive-polarity subpixels corresponding to one touch sensing electrode | Number of negative-polarity subpixels corresponding to one touch sensing electrode | Polarity number difference | Voltage of touch sensing electrode | White color image |
| 1 | + | + | + | 5760 | 0 | 5760 | >Vcom | Serious roller shutter phenomenon |
| 2 | + | - | + | 3840 | 1920 | 1920 | >Vcom | Slight roller shutter phenomenon |
| 3 | - | + | + | 3840 | 1920 | 1920 | >Vcom | Slight roller shutter phenomenon |
| 4 | + | + | - | 3840 | 1920 | 1920 | >Vcom | Slight roller shutter phenomenon |

| | | | | FP2 | | | |
|---|---|---|---|---|---|---|---|
| Experiment | DLA | DLB | DLC | Number of positive-polarity subpixels corresponding to one touch sensing electrode | Number of negative-polarity subpixels corresponding to one touch sensing electrode | Polarity number difference | Voltage of touch sensing electrode | White color image |
| 1 | - | - | - | 0 | 5760 | -5760 | <Vcom | Serious roller shutter phenomenon |
| 2 | - | + | - | 1920 | 3840 | -1920 | <Vcom | Slight roller shutter phenomenon |
| 3 | + | - | - | 1920 | 3840 | -1920 | <Vcom | Slight roller shutter phenomenon |
| 4 | - | - | + | 1920 | 3840 | -1920 | <Vcom | Slight roller shutter phenomenon |

FIG. 8A

METHOD FOR TESTING TOUCH DISPLAY PANEL

RELATED APPLICATIONS

This application claims priority to Chinese Application Serial Number 202011059911.3 filed Sep. 30, 2020, which is herein incorporated by reference.

BACKGROUND

Field of Invention

The invention is related to a display panel test, and more particularly to a method for testing a touch display panel.

Description of Related Art

With the evolution of display and panel production technologies, flat display panels are now applied in various types of electronic products. For example, smart phones, tablets, laptops, or monitors, etc., are all equipped with a flat display panel. Further, touch sensing technology can also be utilized for the production of flat display panels, so that flat display panels also have touch operation functions, thus facilitating convenience for user operation. Among the main touch technologies currently used for the display devices, an in-cell touch technology integrates production of touch sensing electrodes into a manufacturing process of display panel, in which common electrodes are also arranged for touch sensing. In a production process of in-cell touch display panel, an image display test is often performed to confirm display accuracy before a circuit board and a chip are assembled, such that a pixel structure can be tested and repaired in time if any problem is found. However, a common voltage on the touch sensing electrodes on a pixel electrode would be affected and shifted by the polarity of the pixel electrode, and thus when a color image display test is performed on the touch display panel, the non-uniform voltage level of the common voltage signal would lead to image display problems, such as a roller shutter effect. Although the above image display problems can be solved by turning on a scanning signal at the same time, yet such method could not be used to detect a gate driver on array (GOA) function, resulting in risks of missing product problems inspection missing and erroneous release.

SUMMARY

The invention is to provide a method for testing a touch display panel, in which the number of subpixels with positive polarity are the same as the number of pixels with negative polarity in each frame period for each touch sensing electrode, and therefore common voltage signals respectively written into the touch sensing electrodes keep at the same voltage level, thereby avoiding image display problems (e.g. a roller shutter effect) due to non-uniformity of common voltage signals during a color image display test on the touch display panel, thus improving test accuracy.

One aspect of the invention is directed to a method for displaying an image on a touch display panel. The touch display panel includes a substrate and a plurality of subpixels disposed on the substrate, each of the subpixels includes a pixel electrode and a common electrode, the common electrodes of X number of subpixels are electrically connected to form a touch sensing electrode, X is an integer greater than or equal to 2, and the method includes: dividing a frame period of the image into a first subframe period and a second subframe period; transmitting pixel data to some of the X number of subpixels in the first subframe period, wherein the number of the subpixels receiving pixel data of positive polarity in the some of the X number of subpixels subtracted by the number of the subpixels receiving pixel data of negative polarity in the some of the X number of subpixels is defined as a first polarity number difference; and others of the X number of subpixels in the second subframe period, wherein the number of the subpixels receiving pixel data of positive polarity in the others of the X number of subpixels subtracted by the number of the subpixels receiving pixel data of negative polarity in the others of the X number of subpixels is defined as a second polarity number difference; wherein a sum of the first polarity number difference and the second polarity number difference is 0.

In one embodiment of the invention, the number of subpixels in the some of the X number of subpixels is X/2, and the number of subpixels in the others of the X number of subpixels is X/2.

In one embodiment of the invention, the touch display panel further includes a plurality of scan lines, and each of the subpixels is electrically connected to a corresponding one of the plurality of scan lines, wherein some of the plurality of scan lines are enabled in the first subframe period, and others of the plurality of scan lines are enabled in the second subframe period.

In one embodiment of the invention, the number of the scan lines is N, N is an integer greater than or equal to 2, the number of the some of the scan lines is (N/2), and the number of the others of the scan lines is (N/2).

In one embodiment of the invention, the scan lines include $1^{st}$ to $N^{th}$ scan lines, the $1^{st}$ to $N^{th}$ scan lines are sequentially disposed along a direction, the some of the scan lines include $(2K-1)^{th}$ scan lines of the $1^{st}$ to $N^{th}$ scan lines, and the others of the scan lines include $(2K)^{th}$ scan lines of the $1^{st}$ to $N^{th}$ scan lines, wherein K is an integer from 1 to N/2, and N is an even integer.

In one embodiment of the invention, the X number of subpixels include a plurality of first subpixels configured to display a first color, wherein some of the first subpixels receive pixel data of positive polarity in the first subframe period, and others of the first subpixels receive pixel data of negative polarity in the second subframe period.

In one embodiment of the invention, the number of the first subpixels in the some of the first subpixels is equal to the number of first subpixels in the others of the first subpixels.

In one embodiment of the invention, the method further includes dividing another frame period of the display image into a third subframe period and a fourth subframe period, wherein the second subframe period is subsequent to the first subframe period, the fourth subframe period is subsequent to the third subframe period, the some of the plurality of first subpixels receive pixel data of negative polarity during the third subframe period, and the others of the plurality of first subpixels receive pixel data of positive polarity during the fourth subframe period.

In one embodiment of the invention, the X number of subpixels further include a plurality of second subpixels configured to display a second color and a plurality of third subpixels configured to display a third color, wherein some of the second subpixels receive pixel data of positive polarity in the first subframe period, others of the second subpixels receive pixel data of negative polarity in the second subframe period, some of the third subpixels receive pixel data of negative polarity in the first subframe period, and others of the third subpixels receive pixel data of positive polarity in the second subframe period.

In one embodiment of the invention, the number of the first subpixels in the X number of subpixels, the number of the second subpixels in the X number of subpixels and the number of the third subpixels in the X number of subpixels are equal to each other, and the number of the first subpixels in the some of the first subpixels, the number of the second subpixels in the some of the second subpixels, the number of the third subpixels in the some of the third subpixels, the number of the first subpixels in the others of the first subpixels, the number of the second subpixels in the others of the second subpixels, and the number of the third subpixels in the others of the third subpixels are equal to each other.

In one embodiment of the invention, the number of the first subpixels in the X number of subpixels, the number of the second subpixels in the X number of subpixels and the number of the third subpixels in the X number of subpixels are equal to one third of X, and the number of the first subpixels in the some of the first subpixels, the number of the second subpixels in the some of the second subpixels, the number of the third subpixels in the some of the third subpixels, the number of the first subpixels in the others of the first subpixels, the number of the second subpixels in the others of the second subpixels, and the number of the third subpixels in the others of the third subpixels are equal to one sixth of X.

In one embodiment of the invention, the touch display panel further includes a plurality of data lines, a plurality of first thin film transistors, a plurality of second thin film transistors, a plurality of third thin film transistors, a first test pad, a second test pad and a third test pad, the data lines and the subpixels are disposed in an active area of the touch display panel, and the first to third thin film transistors and the first to third test pads are disposed in a peripheral area of the touch display panel, wherein the data lines are divided into a first group of data lines, a second group of data lines and a third group of data line, the subpixels include a plurality of first subpixels configured to display a first color, a plurality of second subpixels configured to display a second color and a plurality of third subpixels configured to display a third color, each of the first subpixels is electrically connected to a corresponding data line of the first group of data lines, each of the second subpixels is electrically connected to a corresponding data line of the second group of data lines, and each of the third subpixels is electrically connected to a corresponding data line of the third group of data lines, wherein each of the first to third thin film transistors includes a control terminal, a first terminal and a second terminal, the first terminal of each of the first thin film transistors is electrically connected to a corresponding data line of the first group of data lines, the first terminal of each of the second thin film transistors is electrically connected to a corresponding data line of the second group of data lines, the first terminal of each of the third thin film transistors is electrically connected to a corresponding data line of the third group of data lines, the second terminals of the first thin film transistors are electrically connected to the first test pad, the second terminals of the second thin film transistors are electrically connected to the second test pad, and the second terminals of the third thin film transistors are electrically connected to the third test pad.

In one embodiment of the invention, the data lines include $1^{st}$ to $M^{th}$ data lines, the $1^{st}$ to $M^{th}$ data lines are sequentially disposed along a direction, the first group of data lines include $(3K-2)^{th}$ data lines, the second group of data lines include $(3K-1)^{th}$ data lines, and the third group of data lines include $(3K)^{th}$ data lines, wherein K is an integer from 1 to M/3, and M is a positive multiple of 3.

In one embodiment of the invention, the method further includes transmitting an enabling voltage to each of the control terminals of the first to third thin film transistors to turn on each of the first to third thin film transistors before the some of the X number of subpixels receive pixel data in the first subframe period and the others of the X number of subpixels receiving pixel data in the second subframe period.

In one embodiment of the invention, the touch display panel further includes a fourth test pad disposed in the peripheral area of the touch display panel, and the control terminals of the first to third thin film transistors are electrically connected to the fourth test pad.

In one embodiment of the invention, each of the plurality of subpixels further includes at least one insulating layer disposed between the pixel electrode and the common electrode, and the pixel electrode is disposed over or below the common electrode in each of the subpixels.

BRIEF DESCRIPTION OF THE DRAWINGS

The invention can be more fully understood by reading the following detailed description of the embodiment, with reference made to the accompanying drawings as follows.

FIGS. 7A-7B are respective schematic diagrams of polarities of subpixels corresponding to the same touch sensing electrode in FIG. 5 during a frame period and a next frame period.

FIG. 8A shows experimental results of voltage changes of a touch sensing electrode and image display results of the touch display panel after transmitting pixel data of various combination of polarities into first to third groups of data lines during a frame period and a next frame period.

DETAILED DESCRIPTION

Figure 1:
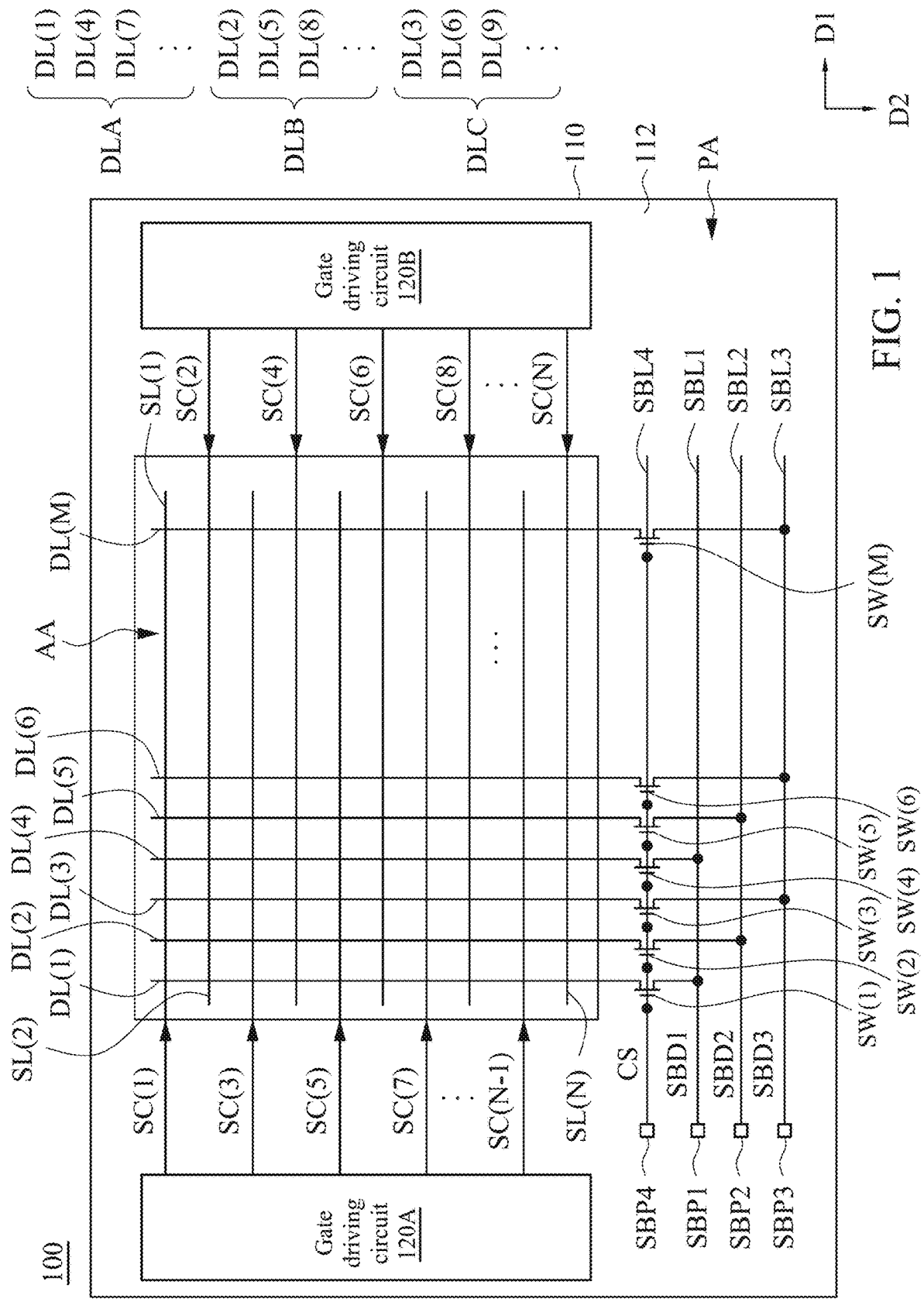
FIG. 1 is a schematic diagram of a display device in accordance with some embodiments of the invention.

Specific embodiments of the present invention are further described in detail below with reference to the accompanying drawings, however, the embodiments described are not intended to limit the present invention and it is not intended for the description of operation to limit the order of implementation.

It will be understood that, although the terms "first," "second," "third" . . . etc., may be used herein to describe various elements, components and/or signals, these elements, components and/or signals, should not be limited by these terms. These terms are only used to distinguish elements, components and/or signals.

Terms used herein are only used to describe the specific embodiments, which are not used to limit the claims appended herewith. Unless limited otherwise, the term "a," "an," "one" or "the" of the single form may also represent the plural form. In addition, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Regarding the term "coupled" used in the following description, it may be used to indicate that two or more elements are in direct physical or electrical contact with each other, or may also mean that two or more elements may not be in direct contact with each other. "Coupled" may still be used to indicate that two or more elements cooperate or interact with each other.

The document may repeat reference numerals and/or letters in the various examples. This repetition is for the purpose of simplicity and clarity and does not in itself dictate a relationship between the various embodiments and/or configurations discussed.

Referring to FIG. 1, FIG. 1 is a schematic diagram of a touch display device 100 in accordance with some embodiments of the invention. The touch display device 100 includes a touch display panel 110 and gate driving circuits 120A and 120B. The touch display panel 110 may be, for example, a liquid crystal touch display panel of twisted nematic (TN) mode, in-plane switching (IPS) mode, fringe-field switching (FFS) mode, vertical alignment (VA) mode or another different mode, or a light-emitting diode (LED) touch display panel such as an organic light-emitting diode (OLED) touch display panel or a micro light-emitting diode (micro LED) touch display panel. The touch display panel 110 has an active area AA and a peripheral area PA, multiple data lines DL(1)-DL(M), scan lines SL(1)-SL(N) and pixels (not shown) are formed on a substrate 112 of the display panel 110 and disposed in the active area AA, while test pads SBP1-SBP4, test lines SBL1-SBL4 and thin film transistors SW(1)-SW(M) are formed on the substrate 112 and disposed in the peripheral area PA. The data lines DL(1)-DL(M) are sequentially disposed along a direction D1, and the scan lines SL(1)-SL(N) are sequentially disposed along a direction D2. In the context, the data lines DL(1)-DL(M) may be referred to as $1^{st}$ to $M^{th}$ data lines, respectively; and the scan lines SL(1)-SL(N) may be referred to as $1^{st}$ to $N^{th}$ scan lines, respectively. Terminals of the test lines SBL1-SBL4 are respectively connected to the test pads SBP1-SBP4. Each of the thin film transistors SW(1)-SW(M) has a control terminal, a first terminal and a second terminal. In the context, "control terminal," "first terminal" and "second terminal" of the thin film transistor are respectively the gate, the source and the drain of the thin film transistor, or alternatively respectively the gate, the drain and the source of the thin film transistor. The control terminals of the thin film transistors SW(1)-SW(M) are all coupled to the test line SBL4 and are electrically connected to the test pad SBP4 through the test line SBL4. The first terminals of the thin film transistors SW(1)-SW(M) are respectively coupled to the data lines DL(1)-DL(M). The second terminals of the thin film transistors SW(1)-SW(M) are sequentially and alternately coupled to the test lines SBL1-SBL3, in which the second terminals of the thin film transistors SW(1), SW(4), SW(7), . . . are electrically connected to the test pad SBP1 through the test line SBL1, the second terminals of the thin film transistors SW(2), SW(5), SW(8), . . . are electrically connected to the test pad SBP2 through the test line SBL2, and the second terminals of the thin film transistors SW(3), SW(6), SW(9), . . . are electrically connected to the test pad SBP3 through the test line SBL3. Therefore, when the thin film transistors SW(1)-SW(M) are turned on, the data lines DL(1), DL(4), DL(7), . . . may be electrically connected to the test line SBL1 and the test pad SBP1 respectively through the thin film transistors SW(1), SW(4), SW(7), . . . , the data lines DL(2), DL(5), DL(8), . . . may be electrically connected to the test line SBL2 and the test pad SBP2 respectively through the thin film transistors SW(2), SW(5), SW(8), . . . , and the data lines DL(3), DL(6), DL(9), . . . may be electrically connected to the test line SBL3 and the test pad SBP3 respectively through the thin film transistors SW(3), SW(6), SW(9), . . . . The test pads SBP1-SBP4 respectively receive the pixel signals SBD1-SBD3 and a gate control signal CS. For example, after the touch display panel 110 is fabricated, an image display test is performed on the touch display panel 110 to determine whether the touch display panel 110 is normal before shipment. When an image display test is performed on the touch display panel 110, the gate control signal CS switches to an enabling voltage level (e.g. a high voltage level) to turn on the thin film transistors SW(1)-SW(M), such that the data lines DL(1)-DL(M) respectively and alternately receive the pixel signals SBD1-SBD3. For example, the pixel signals SBD1, SBD2, SBD3, SBD1, SBD2, SBD3, . . . are respectively transmitted to the data lines DL(1), DL(2), DL(3), DL(4), DL(5), DL(6), . . . , i.e., the pixel signals SBD1, SBD2, SBD3 are respectively transmitted to the data lines DL(3K−2), DL(3K−1), DL(3K), i.e., the $(3K-2)^{th}$ data line, the $(3K-1)^{th}$ data line and the $(3K)^{th}$ data line of the $1^{st}$ to $M^{th}$ data lines, where K is an integer from 1 to M/3, and M is a positive multiple of 3. The data lines DL(1)-DL(M) may be divided into a first group of data lines DLA, a second group of data lines DLB and a third group of data lines DLC. The first group of data lines DLA include the data lines DL(3K−2), i.e., the data lines DL(1), DL(4), DL(7), . . . , the second group of data lines DLB include the data lines DL(3K−1), i.e., the data lines DL(2), DL(5), DL(8), . . . , and the third group of data lines DLC include the data lines DL(3K), i.e., the data lines DL(3), DL(6), DL(9), In the context, the thin film transistors SW(1), SW(4), SW(7), . . . , may be referred to as a first thin film transistor; each of the thin film transistors SW(3K−1), i.e., the thin film transistors SW(2), SW(5), SW(8), . . . , may be referred to as a second thin film transistor; and each of the thin film transistors SW(3K), i.e., the thin film transistors SW(3), SW(6), SW(9), . . . , may be referred to as a third thin film transistor; and the test pads SBP1, SBP2, SBP3, SBP4 may be referred to as a first test pad, a second test pad, a third test pad and a fourth test pad, respectively. When an image display test is performed on the display panel 110, because the transistors SW(1)-SW(M) are all turned on, the first to third groups of data lines DLA-DLC are electrically connected to the test pads SBP1-SBP3, respectively, such that the pixel signals SBD1, SBD2, SBD3 may be respectively transmitted to the first to third groups of data lines DLA-DLC respectively through the test pads SBP1, SBP2, SBP3. In addition, if the image testing result of the touch display panel 110 is normal and the touch display panel 110 is shipped to a customer, the voltage level of the gate control signal CS is a disabling voltage level (e.g. a low voltage level) for turning off the thin film transistors SW(1)-SW(M) when the customer uses the touch display panel 110, so as to prevent noise from being transmitted to the data lines DL(1)-DL(M) through the test pads SBP1-SBP3 and the test lines SBL1-SBL3 to affect image display. In addition, in the embodiment where the touch display panel 110 is a liquid crystal display panel, the touch display panel 110 further includes another substrate and a liquid crystal layer (not shown), in which the liquid crystal layer is between the substrate 112 and the another substrate.

It is noted that the touch display panel 110 may further include M number of bonding pads (not shown in FIG. 1) which are disposed in the peripheral area PA. The M number of bonding pads are electrically connected to the data lines DL(1)-DL(M), respectively, and may be used to electrically connect to a source driving circuit (e.g. a source driver chip), such that the source driving circuit may provide signals to the data lines DL(1)-DL(M) respectively through the M number of bonding pads. For example, as described above, after the touch display panel 110 is fabricated, an image display test is performed on the touch display panel 110 to determine whether the touch display panel 110 is normal before shipment, in which the image display test may be performed after the touch display panel 110 is fabricated and before a source driving circuit is electrically connected to the M number of bonding pads, but the invention is not limited thereto. In another embodiment, an image display test may be performed on the touch display panel 110 to determine whether the touch display panel 110 is normal after the source driving circuit is electrically connected to the M number of bonding pads.

The gate driving circuits 120A, 120B are electrically connected to the scan lines SL(1)-SL(N), and are configured to generate and transmit scan signals SC(1)-SC(N) to the scan lines SL(1)-SL(N). In particular, the gate driving circuits 120A, 120B are disposed respectively at a portion and another portion of the peripheral area PA which are respectively located at left and right sides of the active area AA of the touch display panel 110, in which the gate driving circuit 120A provides and respectively transmit odd stage scan signals SC(1), SC(3), . . . , SC(N−1) (N is even) to the odd-numbered scan lines SL(1), SL(3), SL(N−1), i.e., the $(2K-1)^{th}$ scan lines of the $1^{st}$ to $N^{th}$ scan lines, while the gate driving circuit 120B provides and respectively transmit even stage scan signals SC(2), SC(4), SC(N) to the even-numbered scan lines SL(2), SL(4), SL(N), i.e., the $(2K)^{th}$ scan lines of the $1^{st}$ to $N^{th}$ scan lines, where K is an integer from 1 to N/2, and N is an even integer, but the invention is not limited thereto.

The touch display panel 110 in the invention may be a system on glass (SOG) panel. That is, in the invention, gate driving circuits 120A, 120B are formed in the peripheral area PA of the touch display panel 110. As such, the electrical components in the active area AA and the gate driving circuits 120A, 120B in the peripheral area PA may be formed simultaneously by the same process or processes. For example, the thin film transistors in the gate driving circuits 120A, 120B and in the active area AA of the touch display panel 110 may be formed simultaneously by the same process or processes. In addition, the thin film transistors SW(1)-SW(M) in the peripheral area PA and the thin film transistors in the active area AA of the touch display panel 110 may also be formed simultaneously by the same process or processes, but the invention is not limited thereto.

Figure 2:
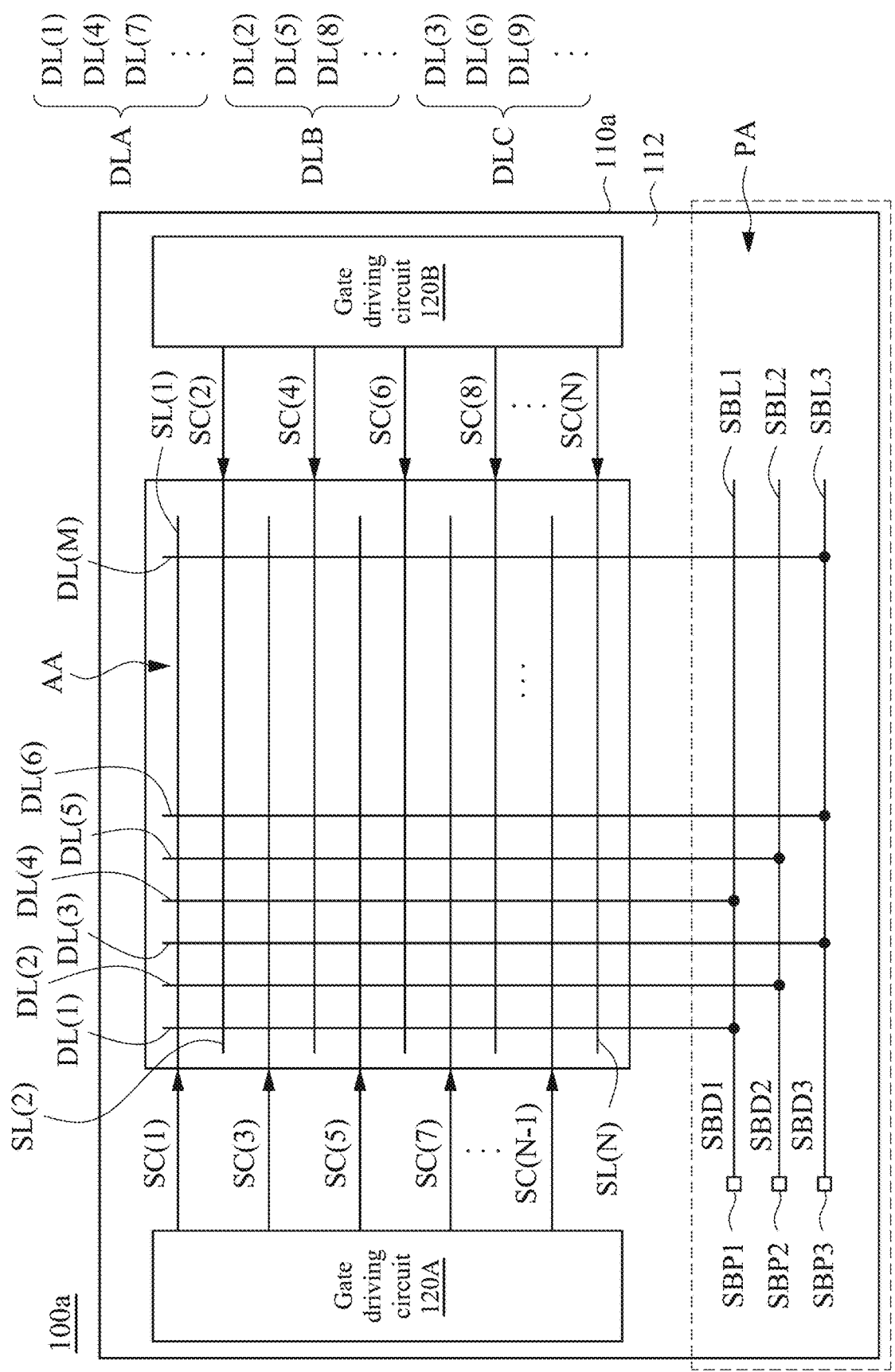
FIG. 2 is a schematic diagram of a gate driving circuit in accordance with some other embodiments of the invention.

Referring to FIG. 2, FIG. 2 is a schematic diagram of a touch display panel 100a in accordance with some other embodiments of the invention. The touch display panel 100a includes a display panel 110a and gate driving circuits 120A, 120B. The difference between FIG. 1 and FIG. 2 is that, the touch display panel 100a in FIG. 2 does not have the thin film transistors SW(1)-SW(M), the test line SBL4 and the test pad SBP4. As shown in FIG. 2, the first group of data lines DLA (e.g. the data lines DL(1), DL(4), DL(7), . . . ) may be electrically connected to the test pad SBP1 through the test line SBL1, the second group of data lines DLB (e.g. the data lines DL(2), DL(5), DL(8), . . . ) may be electrically connected to the test pad SBP2 through the test line SBL2, and the third group of data lines DLC (e.g. the data lines DL(3), DL(6), DL(9), . . . ) may be electrically connected to the test pad SBP3 through the test line SBL3. When an image display test is performed on the touch display panel 110a, the pixel signals SBD1-SBD3 may be respectively transmitted to the first to third groups of data lines DLA-DLC respectively through the test pads SBP1-SBP3. If the image display test result of the touch display panel 110a is normal, a process (e.g. a cutting process) may be performed to remove the part of the touch display panel 110a surrounded by a dashed line shown in FIG. 2 before shipment, so as to prevent noise from being transmitted to the data lines DL(1)-DL(M) through the test pads SBP1-SBP3 and the test lines SBL1-SBL3 and affecting image display when the touch display panel 110a is used by a user. Similarly, the touch display panel 110a may further include M number of bonding pads (not shown in FIG. 2) disposed in the peripheral area PA. The M number of bonding pads are electrically connected to the data lines DL(1)-DL(M), respectively, and may be used to electrically connect a source driving circuit (e.g. a source driver chip), such that the source driving circuit provides signals to the data lines DL(1)-DL(M) respectively through the M number of bonding pads. For example, as described above, a process (e.g. a cutting process) is performed to remove the part of the touch display panel 110a surrounded by the dashed line shown in FIG. 2 before shipment, and the area surrounded by the dashed line does not include the M number of bonding pads. That is, the M number of bonding pads are still in the touch display panel 110a after the test pads SBP1-SBP3 and the test lines SBL1-SBL3 are removed, such that the source driving circuit is electrically connected to the M number of bonding pads, but the invention is not limited thereto.

It is noted that the touch display panel 110 is exemplified for the following description, but the invention is not limited thereto. The embodiments in the following description may also be applied to the touch display panel 110a, and the description thereof is not narrated herein.

Figure 3:
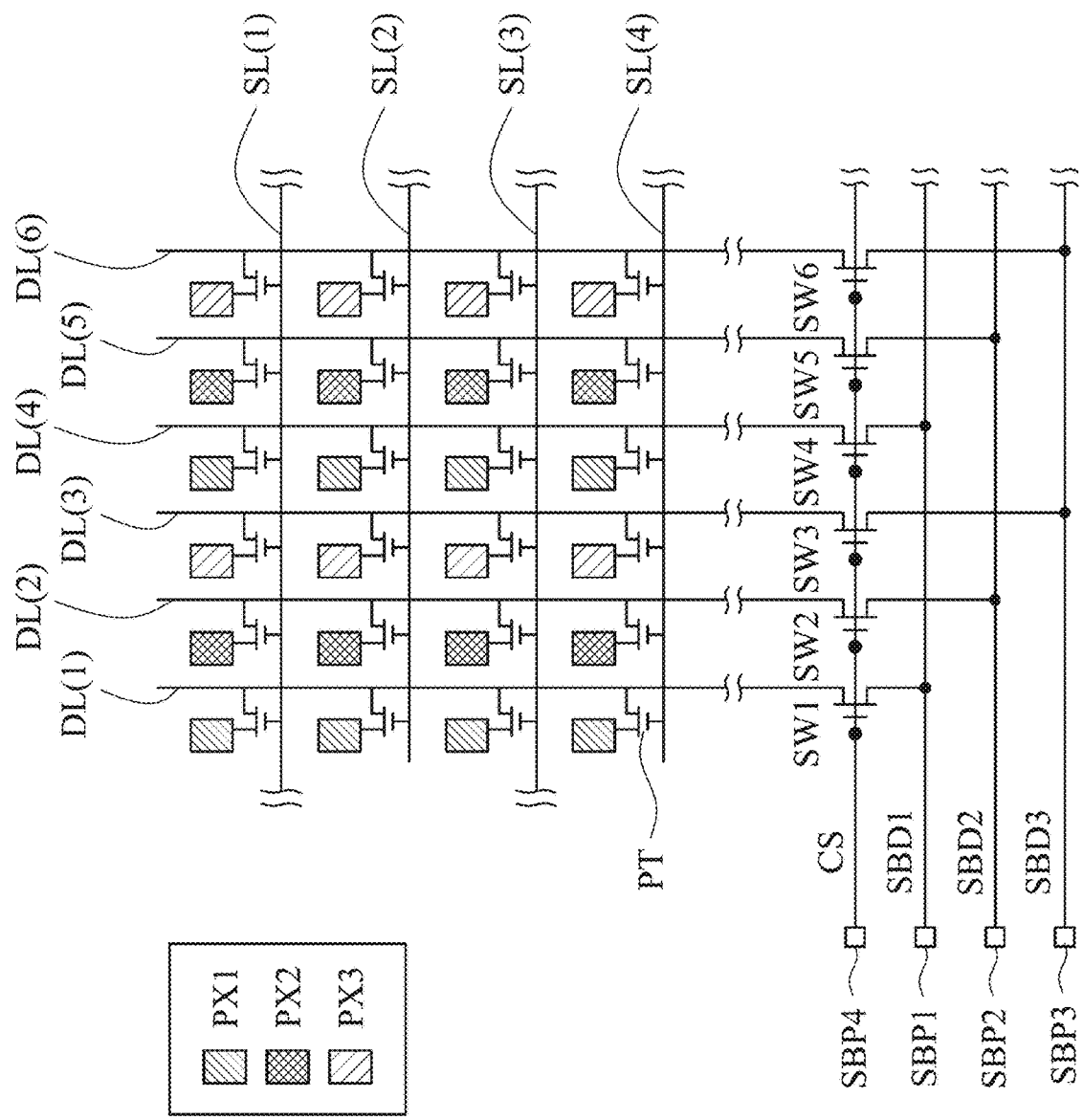
FIG. 3 is an exemplary example of a pixel structure in an active area of the display panel in FIG. 1.
Figure 4:
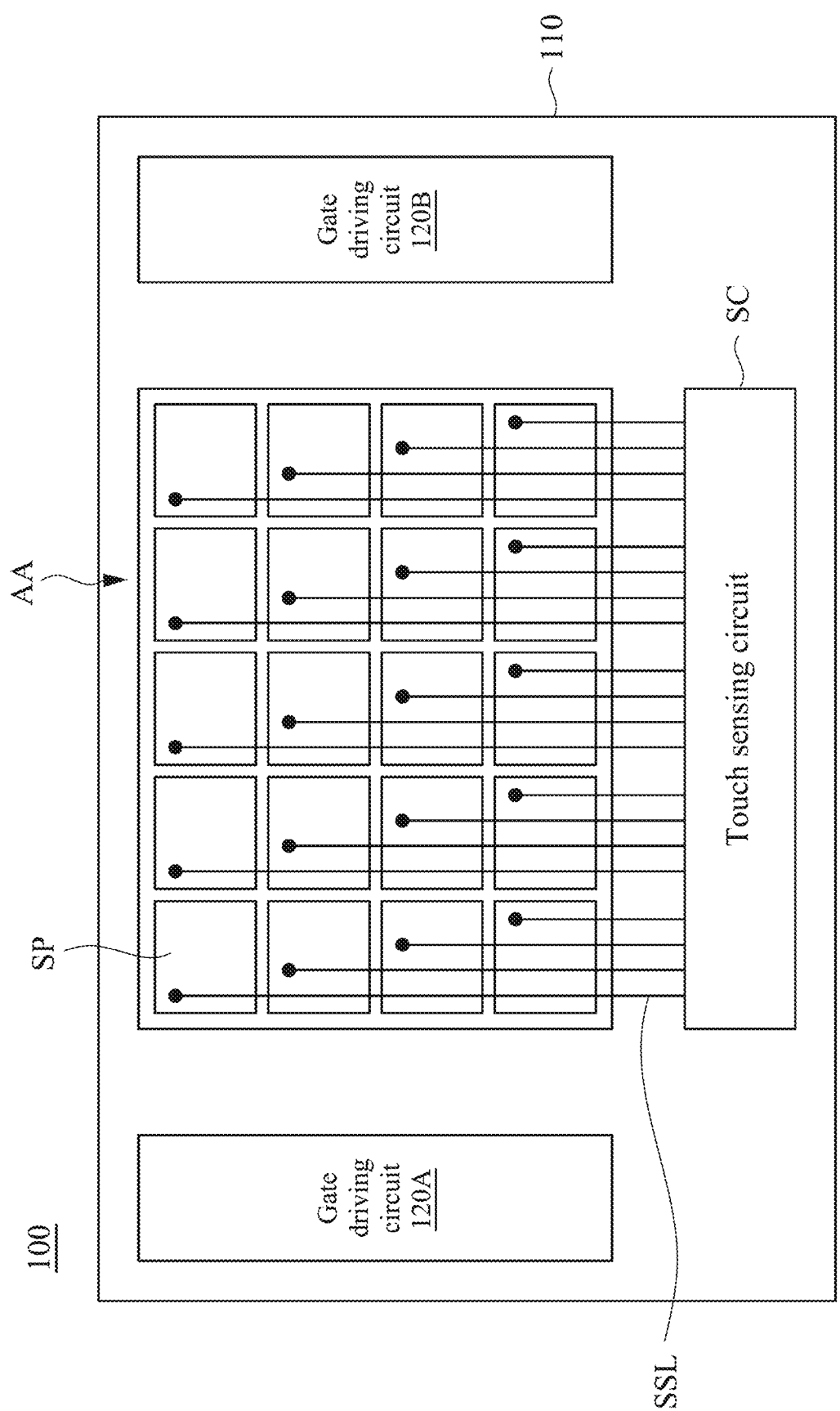
FIG. 4 is a schematic diagram of the display panel in FIG. 1 being a touch display panel.

FIG. 3 is an exemplary example of the pixel structure in the active area AA of the touch display panel 110 in FIG. 1. As shown in FIG. 3, the $m^{th}$ data line is coupled to the thin film transistors PT of all subpixels (the first subpixels PX1, the second subpixels PX2 or the third subpixels PX3) in the $m^{th}$ column of subpixels, where m is an integer less than or equal to M, and the $n^{th}$ scan line is coupled to the thin film transistors PT of all of first to third subpixels PX1-PX3 in the $n^{th}$ row of subpixels, where n is an integer less than or equal to N. Referring to FIGS. 1 and 3, each of the pixel signals SBD1-SBD3 includes pixel data configured to be transmitted to corresponding subpixels of the first to third subpixels PX1-PX3. For each subpixel, when voltage level of the corresponding scan line switches to an enabling voltage level (e.g. a high voltage level), the pixel signal provided by the corresponding data line is transmitted to the pixel electrode through the thin film transistor PT.

Figure 5:
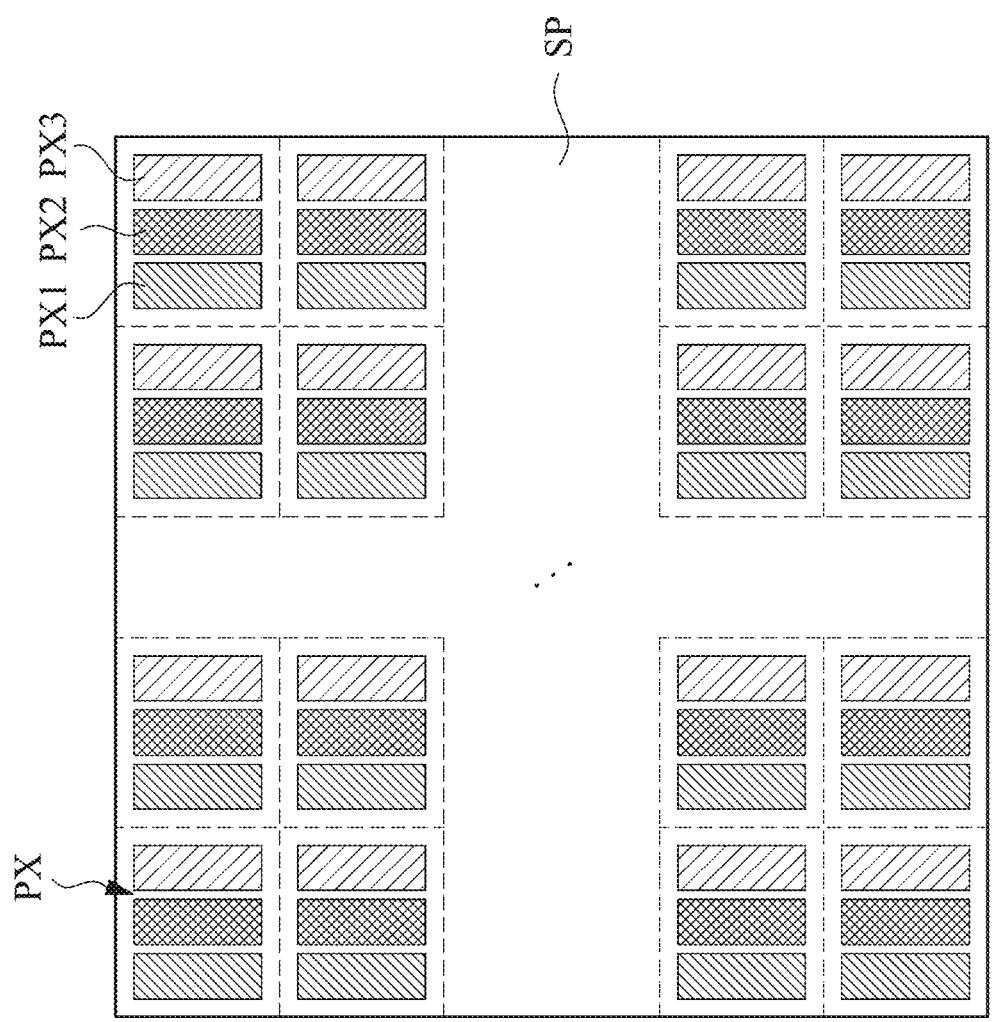
FIG. 5 exemplarily illustrates the corresponding relation between a touch sensing electrode and pixel units in the active area of the touch display panel in FIG. 4.
Figure 6A:
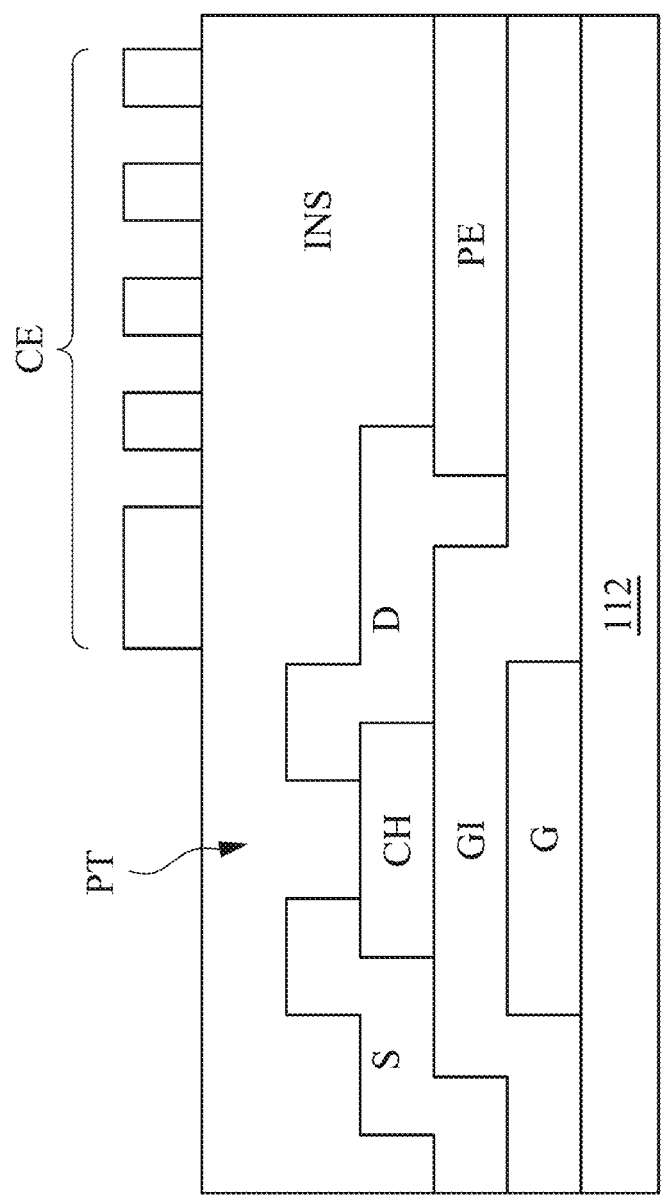
FIGS. 6A-6B are respective cross-sectional views of a subpixel of the touch display panel in accordance with various embodiments.
Figure 6B:
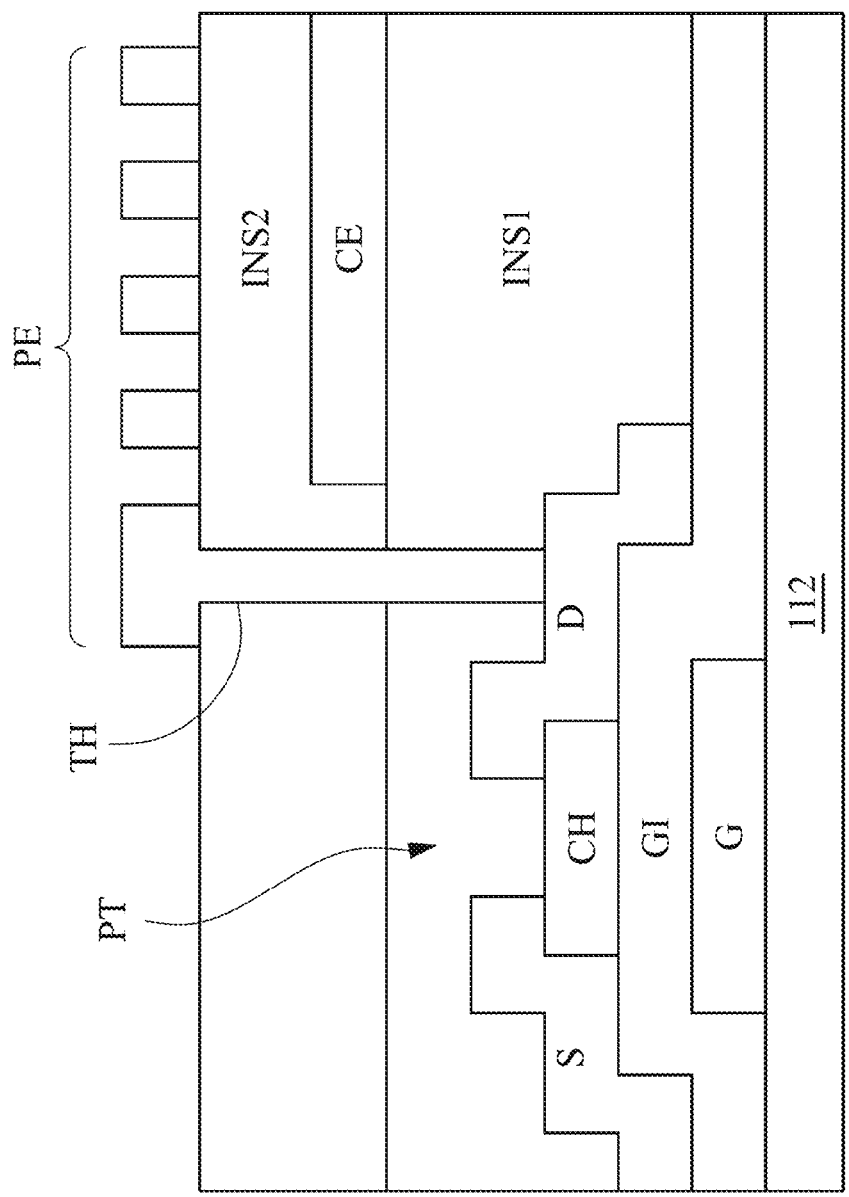

The touch display panel 110 may be an in-cell touch display panel. Referring to FIGS. 4, 5 and 6A-6B, FIG. 4 is a schematic top view of the touch display panel 110, FIG. 5 exemplarily illustrates the corresponding relation between one touch sensing electrode SP and pixel units PX in an area of the touch sensing electrode SP in the active area AA of the touch display panel 110 when viewed along a top view direction of the touch display panel 110, and FIGS. 6A-6B are respective cross-sectional views of a subpixel of the touch display panel 110 in accordance with two embodiments. It is noted that the scan lines SL(1)-SL(M), the data lines DL(1)-DL(M), the thin film transistors SW(1)-SW(M) and the test pads SBP1-SBP4 shown in FIG. 1 are omitted in FIG. 4 for simplicity. The touch display panel 110 includes touch sensing electrodes SP and touch sensing signal lines SSL, in which each touch sensing signal line SSL is electrically connected to the corresponding touch sensing electrode SP and a touch sensing circuit SC. As shown in FIG. 5, each pixel unit PX includes first to third subpixels PX1-PX3, and the first to third subpixels PX1-PX3 are configured to display first to third colors (e.g., red, green and blue colors), respectively.

FIG. 6A is a schematic cross-sectional diagram of the subpixel of the touch display panel 110 in accordance with one embodiment. As shown in FIG. 6A, each of the first to third subpixels PX1-PX3 includes a thin film transistor PT, a pixel electrode PE, an insulating layer INS and a common electrode CE. The thin film transistor PT includes a gate electrode G, a gate insulating layer GI, a channel layer CH, a drain electrode D and a source electrode S, in which the drain electrode D is electrically connected to the pixel electrode PE, the insulating layer INS is disposed over the thin film transistor PE and the pixel electrode PE, and the common electrode CE is disposed over the insulating layer INS. In an embodiment where the touch display panel 110 is a liquid crystal touch display panel, the liquid crystal layer (not shown) is disposed over the insulating layer INS and the common electrode CE, i.e., the common electrode CE is between the pixel electrode PE and the liquid crystal layer in a direction perpendicular to the substrate 112.

FIG. 6B is a schematic cross-sectional diagram of the subpixels of the touch display panel 110 in accordance with another embodiment. As shown in FIG. 6B, each of the first to third subpixels PX1-PX3 includes a thin film transistor PT, a pixel electrode PE, insulating layers INS1, INS2 and a common electrode CE. The thin film transistor PT includes a gate electrode G, a gate insulating layer GI, a channel layer CH, a drain electrode D and a source electrode S, in which the gate insulating layer INS1 is disposed over the thin film transistor PT, the common electrode CE is disposed over the insulating layer INS1, the insulating layer INS2 is disposed over the insulating layer INS1 and the common electrode CE, the through hole TH penetrates through the insulating layers INS1, INS2, and the pixel electrode PE is disposed over the insulating layer INS2 and extends through the through hole TH to electrically connect the drain electrode D. In an embodiment where the touch display panel 110 is a liquid crystal touch display panel, the liquid crystal layer (not shown) is disposed over the insulating layer INS2 and the pixel electrode PE; that is, the pixel electrode PE is disposed between the common electrode CE and the liquid crystal layer in a direction perpendicular to the substrate 112. It is noted that any of the insulating layers INS and INS1, INS2 in FIGS. 6A-6B may be a single-layer structure or a multi-layer structure. The touch display panels 110 in FIGS. 6A-6B may be fringe-field switching (FFS) mode touch display panels. In addition, the subpixel structures in FIGS. 6A-6B are merely examples, and the subpixel structure of the touch display panel 110 in the invention is not limited to those shown in FIGS. 6A-6B.

Referring to FIGS. 5 and 6A-6B, each pixel unit PX includes first to third subpixels PX1-PX3, each of the subpixels PX1-PX3 includes a common electrode CE, and the common electrodes CE of the subpixels PX1-PX3 of the pixel units PX in the area of the touch sensing electrode SP are electrically connected with each other to form the touch sensing electrode SP, i.e., the common electrode CE of each of the subpixels PX1-PX3 is a portion of the touch sensing electrode SP. As shown in FIG. 5, each touch sensing electrode SP corresponds to an area of multiple pixel units PX. In other words, an area of each touch sensing electrode SP is overlapped with multiple pixel units PX in a direction perpendicular to the substrate 112 (i.e. a top view direction of the touch display panel 110). For example, the touch display panel 110 includes 720×1536 pixel units PX and 18×32 touch sensing electrodes SP, an area of each touch sensing electrode SP may be overlapped with 40×48 pixel units PX (i.e. 40×48×3 subpixels) in a direction perpendicular to the substrate 112, i.e., the common electrodes of 40×48×3 subpixels are electrically connected to form a touch sensing electrode SP.

Because the touch sensing electrode SP is formed of the common electrodes of the corresponding subpixels, the touch sensing electrode SP receives a common voltage and interacts with the pixel electrodes of the first to third subpixels PX1-PX3 of the pixel units PX to generate an electric field therebetween during the display period of the touch display panel 110, such that liquid crystal molecules in the liquid crystal layer are twisted or rotated by the electric field for the display panel 100 to display images. The touch sensing electrode SP is configured for touch sensing during a touch sensing period of the touch display panel 110. For example, the active period of each frame period may be a display period of the touch display panel 110, while the blank period of each frame period may be a touch sensing period of the touch display panel 110, but the invention is not limited thereto.

Figure 7B:
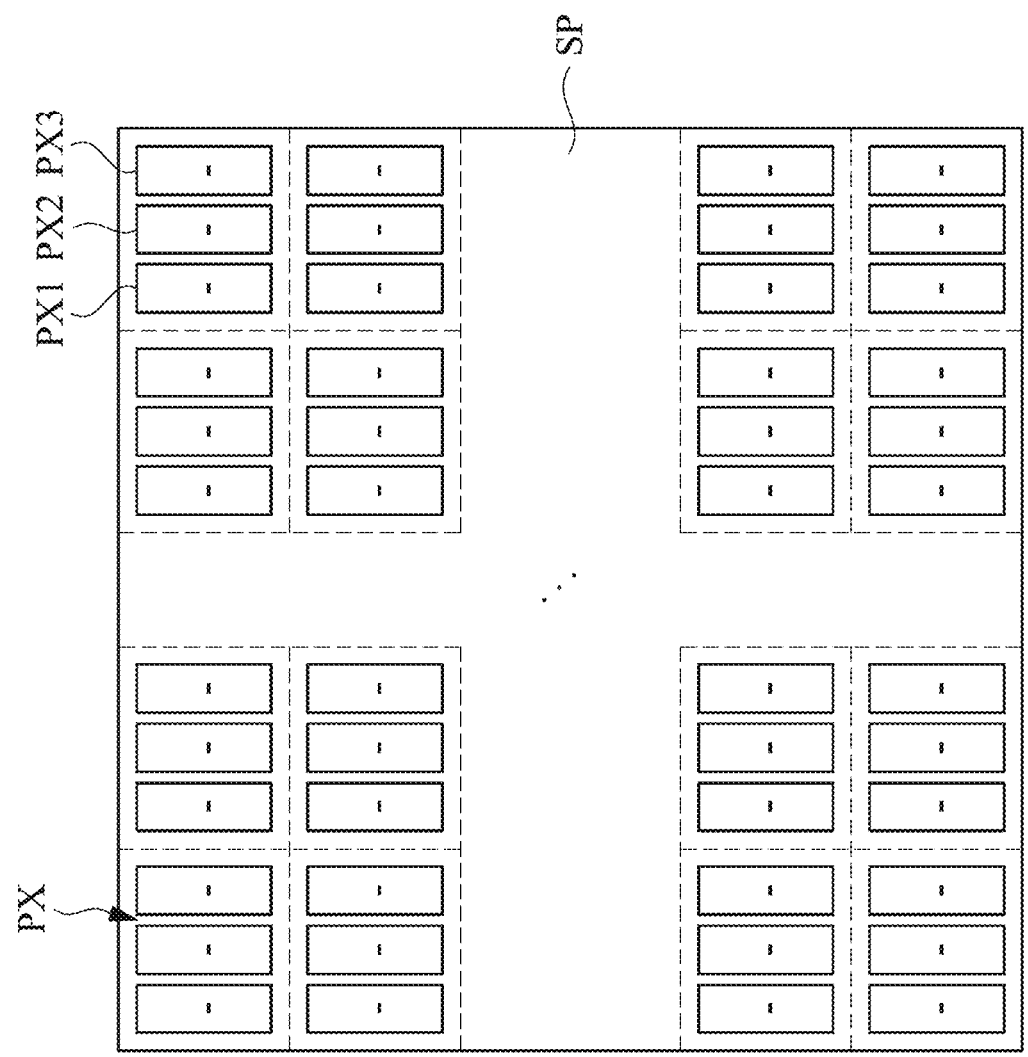
Figure 7C:
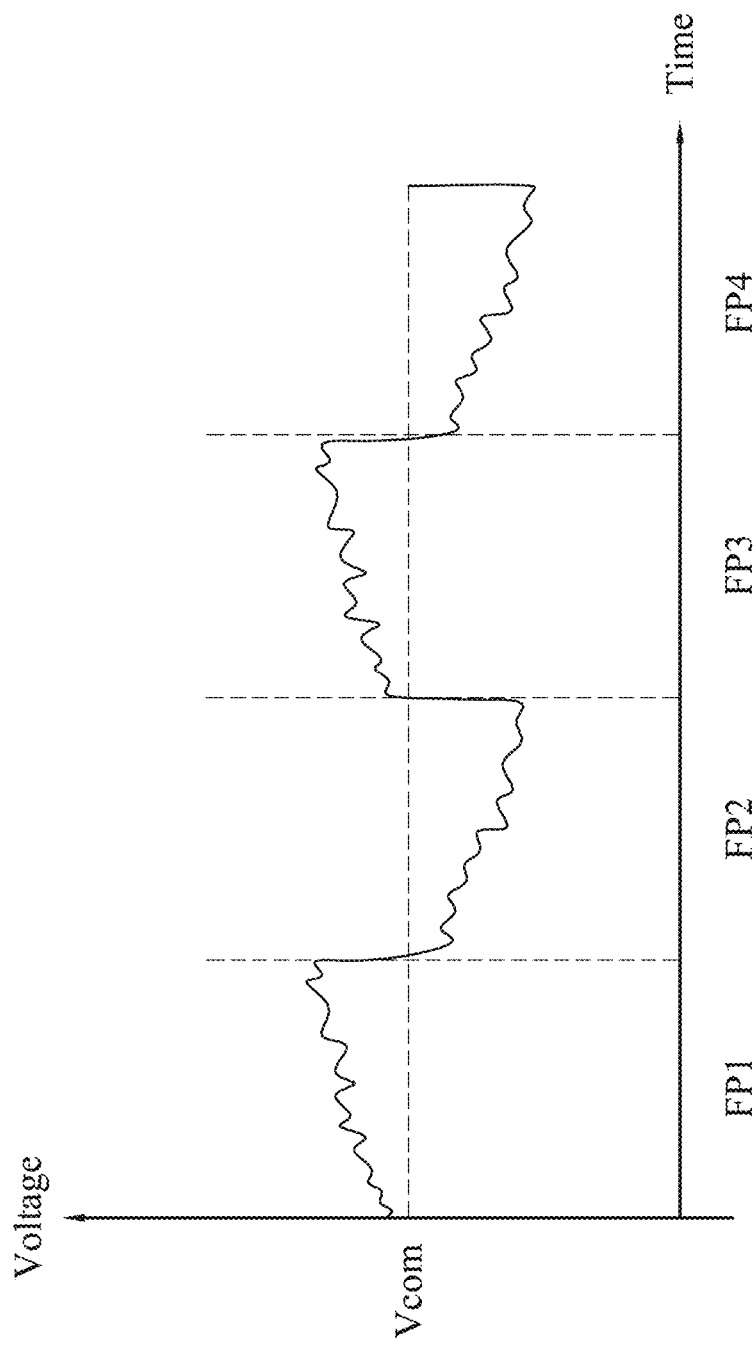
FIG. 7C is a schematic voltage chart of a touch sensing electrode in FIG. 5 during the two frame periods in FIGS. 7A-7B.
Figure 7D:
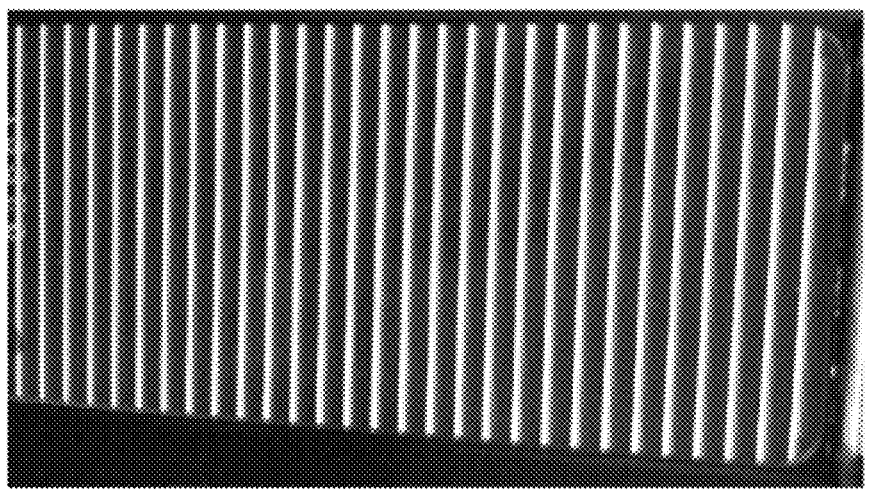
FIG. 7D shows an image displayed by the touch display panel after the subpixels receive pixel data according to the schematic diagrams in FIGS. 7A-7B.

Referring to FIGS. 7A-7D, FIGS. 7A-7B are respective schematic diagrams of polarities of pixel data of the subpixels in FIG. 5 during a frame period and a next frame period, FIG. 7C is a schematic voltage chart of the touch sensing electrode SP in FIG. 5 during the two frame periods in FIGS. 7A-7B, and FIG. 7D shows an image displayed by the touch display panel 110 according to the schematic diagrams in FIGS. 7A-7B. As shown in FIG. 7A, during the frame period (e.g. the frame period FP1 in FIG. 7C), each of the subpixels corresponding to one touch sensing electrode SP (e.g. each of the first to third subpixels PX1-PX3 in an area of the touch sensing electrode SP) receives pixel data of positive polarity (labelled as "+" in FIG. 7A); as shown in FIG. 7B, during the next frame period (e.g. the frame period FP2 in FIG. 7C), each of the subpixels corresponding to the touch sensing electrode SP receives pixel data of negative polarity (labelled as "−" in FIG. 7B). Similarly, during the frame period FP3 in FIG. 7C, each of the subpixels corresponding to one touch sensing electrode SP receives pixel data of positive polarity; and during the frame period FP4 in FIG. 7C, each of the subpixels corresponding to the touch sensing electrode SP receives pixel data of negative polarity. Referring to FIGS. 6A-6B simultaneously, an insulating layer INS or INS2 is between the pixel electrode PE and the common electrode CE, and the voltage change of the pixel electrode PE is coupled to the common electrode CE through the insulating layer INS or INS2, and therefore, as shown in FIG. 7C, during the display period of the touch display panel 110 (e.g. the frame periods FP1-FP4), the predetermined voltage of the touch sensing electrode SP is common voltage Vcom, while when the pixel electrode PE of each of the subpixels corresponding to the touch sensing electrode SP receives pixel data of positive polarity (e.g. the frame periods FP1 and FP3), the voltage of touch sensing electrode SP is higher than the common voltage Vcom due to the voltage change coupling described above; and when the pixel electrode PE of each of the subpixels corresponding to the touch sensing electrode SP receives pixel data of negative polarity (e.g. the frame periods FP2 and FP4), the voltage of the touch sensing electrode SP is lower than the common voltage Vcom due to the voltage change coupling described above, thus resulting in a roller shutter effect (as shown in FIG. 7D) that affects the image display.

Figure 8B:
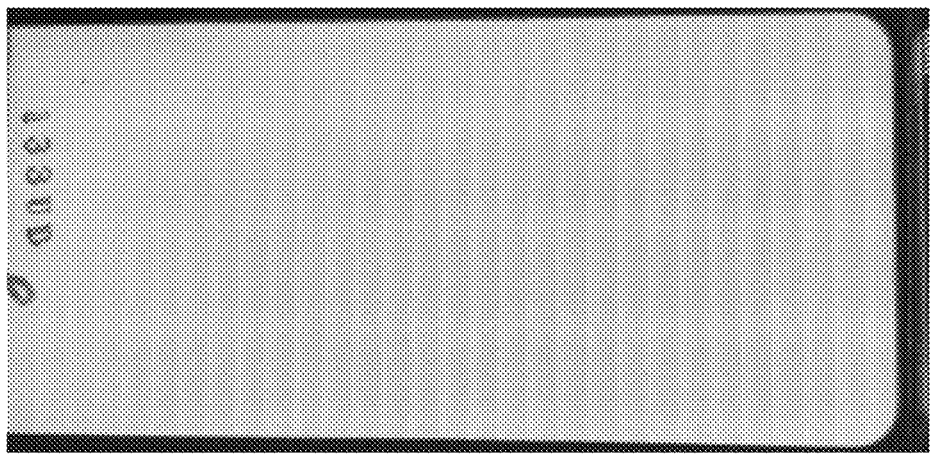
FIG. 8B shows the image displayed by the touch display panel according to Experiment 2 in FIG. 8A.

In order to solve the roller shutter effect, the invention provides several driving methods for experiments as described in the following. FIG. 8A shows experimental results of voltage changes of the touch sensing electrode SP and image display results of the touch display panel 110 after transmitting pixel data of various combination of polarities to the first to third groups of data lines DLA-DLC during a frame period FP1 and a next frame period FP2 (i.e. two consecutive frame periods FP1-FP2), and FIG. 8B shows the image displayed by the touch display panel 110 according to Experiment 2 in FIG. 8A. In the Experiments 1 to 4 of FIG. 8A, the first to third subpixels PX1-PX3 in each pixel unit PX are configured to display red, green and blue colors, respectively, such that the touch display panel 110 is configured to display a white color (i.e., red, green and blue colors are mixed to generate a white color) image. FIG. 8A is an example of the touch sensing electrode SP that corresponds to 40×48 pixel units PX, i.e. the touch sensing electrode SP that correspond to 40×48×3 subpixels (5760 subpixels) and the common electrodes of the 5760 subpixels are electrically connected to form the touch sensing electrode SP. As shown in Experiment 1 of FIG. 8A, in the frame period FP1, each data line of the first to third groups of data lines DLA, DLB, DLC receives pixel data of positive polarity, and therefore, each of the 5760 subpixels receives pixel data of positive polarity, such that the polarity number difference (which equals to the number of positive polarity subpixels minus the number of negative polarity subpixels in an area of one touch sensing electrode) is 5760; in the frame period FP2, each of the 5760 subpixels receives pixel data of negative polarity, and therefore the polarity number difference is −5760, such that the voltage of the touch sensing electrodes SP shifts to be higher and lower than the predetermined common voltage Vcom respectively during the frame periods FP1, FP2, which results in a serious roller shutter effect in the image displayed by the touch display panel 110 (as shown in FIG. 7D). As shown in Experiment 2 of FIG. 8A, in the frame period FP1, each data line of the first and third groups of data lines DLA, DLC receives pixel data of positive polarity, and each data line of the second group of data lines DLB receives pixel data of negative polarity, and therefore two-third of the 5760 subpixels (i.e. 3840 subpixels) are positive polarity subpixels, and one-third of the 5760 subpixels (i.e. 1920 pixels) are negative polarity subpixels, such that the polarity number difference (which equals to the number of positive polarity subpixels minus the number of negative polarity subpixels in an area of one touch sensing electrode) is 1920. Therefore, the voltage of the touch sensing electrode SP is higher than the common voltage Vcom in the frame period FP1 of Experiment 2. However, because the absolute value of the polarity number difference of Experiment 2 (i.e. 1920) is less than that of Experiment 1 (i.e. 5760), the amount of voltage up-shift of the touch sensing electrode SP in Experiment 2 is less than that in Experiment 1. In the frame period FP2, each data line of the first and third groups of data lines DLA, DLC receives pixel data of negative polarity, and each data line of the second group of data lines DLB receives pixel data of positive polarity, and therefore two-third of the 5760 subpixels (i.e. 3840 subpixels) are negative polarity subpixels; the other one-third of the 5760 subpixels (i.e. 1920 pixels) are positive polarity subpixels, such that the polarity number difference is −1920, and therefore, the voltage of the touch sensing electrode SP is lower than the common voltage Vcom in the frame period FP2 of Experiment 2. Nevertheless, the absolute value of polarity number difference of Experiment 2 (i.e. −1920) is less than the absolute value of polarity number difference of Experiment 1 (i.e. −5760), and therefore the voltage drop amount of the touch sensing electrode SP in Experiment 2 is less than that in Experiment 1. Because the absolute value of polarity number difference of Experiment 2 is less than the absolute value of polarity number difference of Experiment 1 in the frame periods FP1, FP2, the roller shutter effect in Experiment 2 is slighter than that in Experiment 1. As shown in FIG. 8B, in Experiment 2, the image displayed by the touch display panel 110 shows a slight roller shutter effect. As shown in Experiment 3 of FIG. 8A, in the frame period FP1, each data line of the second and third groups of data lines DLB, DLC receives pixel data of positive polarity, and each data line of the first group of data lines DLA receives pixel data of negative polarity; in the frame period FP2, each data line of the second and third groups of data lines DLB, DLC receives pixel data of negative polarity, and each data line of the first group of data lines DLA receives pixel data of positive polarity. With the configuration of Experiment 3, the touch display panel 110 also merely shows a slight roller shutter effect similar to that in Experiment 2. As shown in Experiment 4 of FIG. 8A, in the frame period FP1, each data line of the first and second group of data lines DLA, DLB receives pixel data of positive polarity, and each data line of the third group of data lines DLC receives pixel data of negative polarity; in the frame period FP2, each data line of the first and second group of data lines DLA and DLB receives pixel data of negative polarity, and each of the third group of data lines DLC receives pixel data of positive polarity. With the configuration of Experiment 4, the image displayed by the touch display panel 110 also merely shows a slight roller shutter effect similar to that in Experiment 2 or Experiment 3.

As shown in the above experiments, when the absolute value of the polarity number difference (which equals to the number of positive polarity subpixels minus the number of negative polarity subpixels) in an area of one touch sensing electrode) in a frame period decreases, the roller shutter effect in the image displayed by the touch display panel 110 becomes slight. Therefore, when the polarity number difference in a frame period is 0, the roller shutter effect can be completely eliminated, such that the touch display panel 110 displays normal images without roller shutter effect. Therefore, in the invention, during the display period of the touch display panel 110, a frame period may be divided into two subframe periods, e.g. a first subframe and a second subframe, and the sum of the polarity number difference of the first subframe and the polarity number difference of the second subframe is 0. For example, a frame period is divided into a first subframe period and a second subframe period; the polarity number difference is K in the first subframe period of the frame period, and the polarity number difference is −K in the second subframe period of the frame period, where K is an integer greater than or equal to 1, and therefore the sum of the polarity number difference K of the first subframe period and the polarity number difference (−K) of the second subframe period in the frame period is 0, such that the touch display panel 110 displays images normally without the roller shutter effect.

Figure 9A:
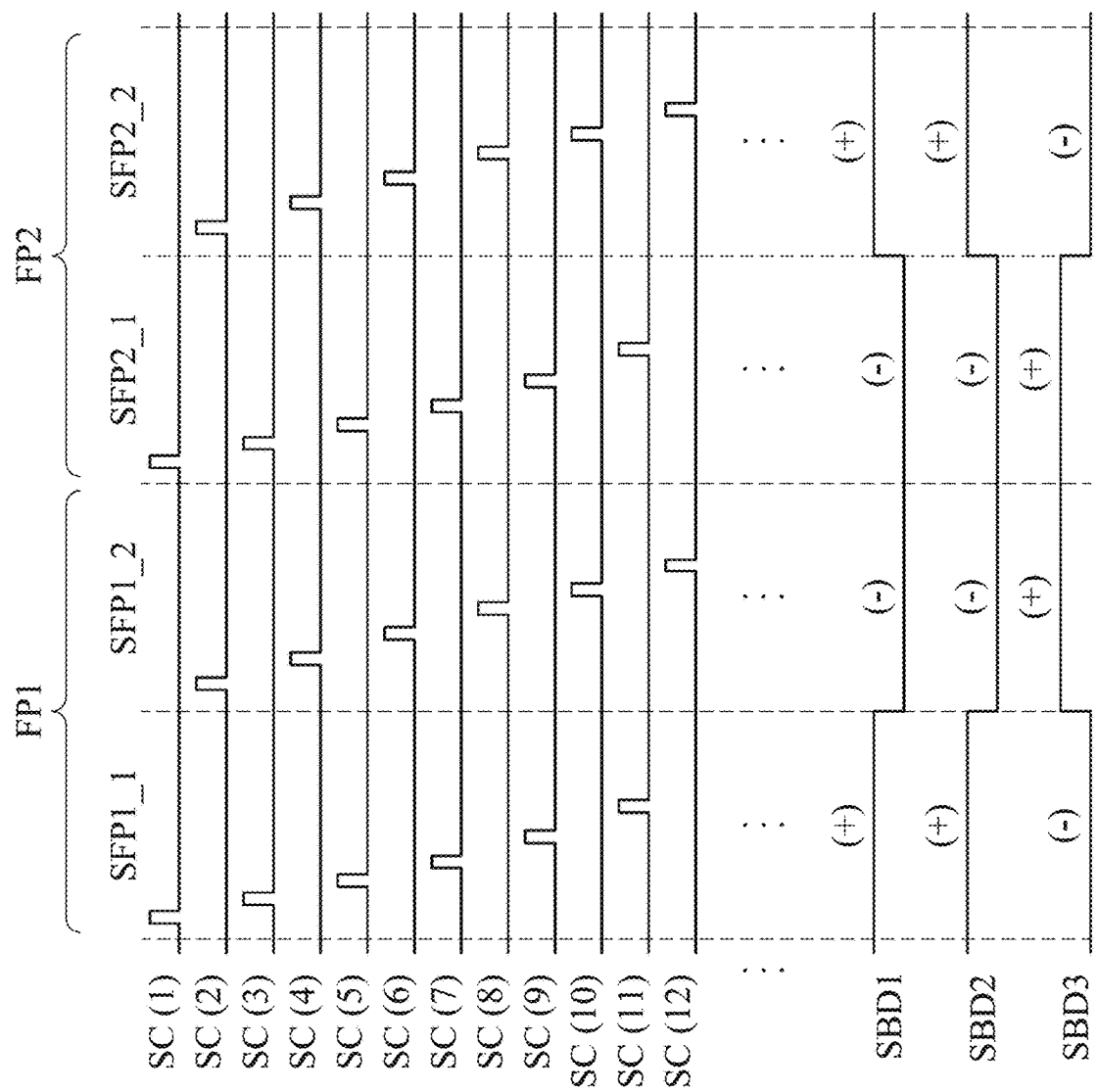
FIG. 9A is a timing sequence diagram of the scan signals and the pixel signals during two consecutive frame periods when performing an image display test on the display apparatus shown in FIG. 1.
Figure 9B:
FIG. 9B shows the image displayed by the touch display panel according to the time sequence chart in FIG. 9A.

FIG. 9A is a timing sequence diagram of the scan signals SC(1)-SC(N) and the pixel signals SBD1-SBD3 during two consecutive frame periods when performing an image display test on the touch display device 100 shown in FIG. 1, and FIG. 9B is the image displayed by the touch display panel 110 according to the time sequence chart in FIG. 9A. As shown in FIG. 9A, the frame period FP1 includes subframe periods SFP1_1, SFP1_2, and the frame period FP2 includes subframe periods SFP2_1, SFP2_2. The odd-numbered scan lines SL(1), SL(3), SL(5), . . . are sequentially enabled in each of the subframe period SFP1_1 of the frame period FP1 and the subframe period SFP2_1 of the frame period FP2, i.e., the odd-numbered scan signals SC(1), SC(3), SC(5), . . . are sequentially switch from a disabling voltage level (e.g. a low voltage level) to an enabling voltage level (e.g. a high voltage level) in each of the subframe period SFP1_1 of the frame period FP1 and the subframe period SFP2_1 of the frame period FP2; the even-numbered scan lines SL(2), SL(4), SL(6), . . . are sequentially enabled in each of the subframe period SFP1_2 of the frame period FP1 and the subframe period SFP2_2 of the frame period FP2, i.e., the voltage levels of the even-numbered scan signals SC(2), SC(4), SC(6), . . . sequentially switch from a disabling voltage level (e.g. a low voltage level) to an enabling voltage level (e.g. a high voltage level) in each of the subframe period SFP1_2 of the frame period FP1 and the subframe period SFP2_2 of the frame period FP2. For convenient illustration, referring to FIGS. 1, 5, an example of 5760 subpixels PX1-PX3 corresponding to a touch sensing electrode SP (i.e. 5760 subpixels PX1-PX3 are disposed in an area of a touch sensing electrode SP when viewed in a direction perpendicular to the substrate 112 of the touch display device 100) is discussed below, but in this invention, the number of the subpixels corresponding to a touch sensing electrode SP is not limited thereto. During the subframe period SFP1_1 of the frame period FP1, each data line of the first and second groups of data lines DLA-DLB receives pixel data of positive polarity (labelled as "(+)" in the pixel signals SBD1, SBD2 during the subframe period SFP1_1 of the frame period FP1), and each data line of the third group of data lines DLC receives pixel data of negative polarity (labelled as "(−)" in the pixel signal SBD3 during the subframe period SFP1_1 of the frame period FP1). Because the odd-numbered scan lines SL(1), SL(3), SL(5), . . . are enabled during the subframe period SFP1_1 of the frame period FP1 (i.e. a half of the subpixels PX1-PX3 in the active area AA of the touch display panel 110 are enabled during the subframe period SFP1_1 of the frame period FP1), therefore, a half of 5760 subpixels corresponding to one touch sensing electrode SP are enabled during the subframe period SFP1_1 of the frame period FP1. The pixel data of the first to third groups of data lines DLA-DLC are transmitted to the half of 5760 subpixels corresponding to one touch sensing electrode SP (i.e. 5760×(½)=2880 subpixels), and therefore two-third and the other one-third of the half of 5760 subpixels (i.e. 5760×(½)×(⅔)=1920 pixels and 5760×(½)×(⅓)=960 pixels) respectively receive pixel data of positive and negative polarities, such that the polarity number difference (which equals to the number of positive polarity subpixels minus the number of negative polarity subpixels) in the subframe period SFP1_1 of the frame period FP1 is 960. During the subframe period SFP1_2 of the frame period FP1, each data line of the first and second groups of data lines DLA-DLB receives pixel data of negative polarity (labelled as "(−)" in the pixel signals SBD1, SBD2 during of the subframe period SFP1_2 of the frame period FP1), and each data line of the third group of data lines DLC receives pixel data of positive polarity (labelled as "(+)" in the pixel signal SBD3 during of the subframe period SFP1_2 of the frame period FP1). Because the even-numbered scan lines SL(2), SL(4), SL(6), . . . are enabled during the subframe period SFP1_2 of the frame period FP1 (i.e. the other half of the subpixels PX1-PX3 in the active area AA of the touch display panel 110 are enabled during the subframe period SFP1_2 of the frame period FP1), the other half of 5760 subpixels corresponding to one touch sensing electrode SP are enabled during the subframe period SFP1_2 of the frame period FP1. The pixel data of the first to third groups of data lines DLA-DLC are transmitted to the other half of 5760 subpixels (i.e. 5760×(½)=2880 subpixels), such that two-third and the other one-third of the other half of 5760 subpixels (i.e. 5760×(½)×(⅔)=1920 pixels and 5760×(½)×(⅓)=960 pixels) respectively receive pixel data of negative and positive polarities, such that the polarity number difference (which equals to the number of positive polarity subpixels minus the number of negative polarity subpixels) in the subframe period SFP1_2 of the frame period FP1 is −960. Therefore, the sum of the polarity number differences respectively in the subframes SFP1_1, SFP1_2 of the frame period FP1 is 960+(−960)=0, such that the touch display panel 110 displays images normally without the roller shutter effect. In some embodiments, for example, in an embodiment where the touch display panel 110 is a liquid crystal touch display panel, the polarities of each subpixel respectively during two consecutive frame periods (e.g. the frame periods FP1, FP2) are opposite, and therefore, the polarity of the pixel data of the pixel signals SBD1, SBD2, SB3 during the frame period FP1 are respectively opposite to the polarity of the pixel data of the pixel signals SBD1, SBD2, SBD3 during the frame period FP2. As shown in FIG. 9A, each data line of the first and second groups of data lines DLA-DLB and each data line of the third group of data lines DLC respectively receive pixel data of positive polarity and pixel data of negative polarity during the subframe period SFP1_1 of the frame period FP1, and each data line of the first and second groups of data lines DLA-DLB and each data line of the third group of data lines DLC respectively receive pixel data of negative polarity and pixel data of positive polarity during the subframe period SFP1_2 of the frame period FP1. Therefore, during the subframe period SFP2_1 of the frame period FP2, each data line of the first and second group of data lines DLA, DLB receives pixel data of negative polarity, and each data line of the third group of data lines DLC receives pixel data of positive polarity, and thus two-third and the other one-third of a half of 5760 subpixels (i.e. 5760×(½)×(⅔)=1920 pixels and 5760×(½)×(⅓)=960 pixels) respectively receive pixel data of negative polarity and pixel data of positive polarity, such that the polarity number difference (which equals to the number of positive polarity subpixels minus the number of negative polarity subpixels) in the subframe period SFP2_1 of the frame period FP2 is −960; during the subframe period SFP2_2 of the frame period FP2, each data line of the first and second groups of data lines DLA, DLB receives pixel data of positive polarity, and each data line of the third group of data lines DLC receives pixel data of negative polarity, and thus two-third and the other one-third of the other half of 5760 subpixels (i.e. 5760×(½)×(⅔)=1920 pixels and 5760×(½)×(⅓)=960 pixels) respectively receive pixel data of positive and pixel data of negative polarities, such that the polarity number difference (which equals to the number of positive polarity subpixels minus the number of negative polarity subpixels) in the subframe period SFP2_2 of the frame period FP2 is 960. Therefore, the sum of the polarity number differences respectively in the subframe periods SFP2_1, SFP2_2 of the frame period FP2 is (−960)+960=0. Summing the above, during the two consecutive frame periods FP1, FP2, each data line of the first group of data lines DLA may receive pixel data of positive polarity, pixel data of negative polarity, pixel data of negative polarity and pixel data of positive polarity in sequence respectively during the subframe periods SFP1_1, SFP1_2, SFP2_1, SFP2_2; each data line of the second group of data lines DLB may receive pixel data of positive polarity, pixel data of negative polarity, pixel data of negative polarity and pixel data of positive polarity in sequence respectively during the subframe periods SFP1_1, SFP1_2, SFP2_1, SFP2_2; each data line of the third group of data lines DLC may receive pixel data of negative polarity, pixel data of positive polarity, pixel data of positive polarity and pixel data of negative polarity in sequence respectively during the subframe periods SFP1_1, SFP1_2, SFP2_1, SFP2_2. However, the invention is not limited thereto. Specifically, each data line of two of the first to third groups of data lines DLA-DLC may receive pixel data of first polarity, pixel data of second polarity, pixel data of second polarity and pixel data of first polarity in sequence respectively during the subframe periods SFP1_1, SFP1_2, SFP2_1, SFP2_2, in which the first polarity and the second polarity are respectively one and the other of positive and negative polarities, and each data line of the other one of the first to third groups of data lines DLA-DLC may receive pixel data of second polarity, pixel data of first polarity, pixel data of first polarity and pixel data of second polarity in sequence respectively during the subframe periods SFP1_1, SFP1_2, SFP2_1, SFP2_2, such that the sum of the polarity number differences respectively in the subframes SFP1_1, SFP1_2 of the subframe FP1 is 0, and the sum of the polarity number differences respectively in the subframe periods SFP2_1, SFP2_2 of the frame period FP2 is 0. For example, if the two of the first to third groups of data lines DLA-DLC are the first and third groups of data lines DLA, DLC, the other one of the first to third groups of data lines DLA-DLC is the second group of data lines DLB, and the first and second polarities are respectively positive polarity and negative polarity, then the sum of the polarity number differences respectively in the subframe periods SFP1_1, SFP1_2 of the frame period FP1 is 960+(−960)=0, and the sum of the polarity number differences respectively in the subframe periods SFP2_1, SFP2_2 of the frame period FP2 is (−960)+960=0. In addition, if the two of the first to third groups of data lines DLA-DLC are the first and second group of data lines DLA, DLB, the other one of the first to third groups of data lines DLA-DLC is the third group of data lines DLC, and the first polarity and the second polarity are respectively negative polarity and positive polarity, then the sum of the polarity number differences respectively in the subframe periods SFP1_1, SFP1_2 of the frame period FP1 is (−960)+960=0, and the sum of the polarity number differences respectively in the subframe periods SFP2_1, SFP2_2 of the frame period FP2 is 960+(−960)=0. Summing the above, the touch display panel includes the first to third groups of data lines DLA-DLC, the display period of the touch display panel includes a frame period, the frame period includes first and second subframe periods which are consecutive, and the first subframe period is before the second subframe period. Two of the first to third groups of data lines DLA-DLC may receive pixel data of first polarity during the first subframe period and pixel data of second polarity during the second subframe period, and the other one of the first to third groups of data lines DLA-DLC may receive pixel data of second polarity during the first subframe period and pixel data of first polarity during the second subframe period. The first and second polarities are respectively positive polarity and negative polarity, or respectively negative polarity and positive polarity. By dividing the frame period into two subframe periods and enabling the sum of the polarity number differences respectively in the two subframes to be 0, the touch display panel 110 displays images normally without the roller shutter effect. In addition, the display period of the touch display panel may further include another frame period, the frame period (e.g., frame period FP1) and the another frame period (e.g., frame period FP2) are consecutive, and the frame period is previous to the another frame period. The frame period and the another frame period are respectively referred to as a first frame period and a second frame period in the following description. The second frame period includes third and fourth subframe periods (e.g., subframe periods SFP2_1, SFP2_2 of the frame period FP2) which are consecutive, and the third subframe period is previous to the fourth subframe period. Two of the first to third groups of data lines DLA-DLC may receive pixel data of second polarity during the third subframe period of the second frame period and pixel data of first polarity during the fourth subframe period of the second frame period, and the other one of the first to third groups of data lines DLA-DLC may receive pixel data of first polarity during the third subframe period of the second frame period and pixel data of second polarity during the fourth subframe period of the second frame period. By dividing the another frame period into two subframe periods and enabling the sum of the polarity number differences respectively in the two subframes to be 0, the touch display panel 110 displays images normally without the roller shutter effect.

Figure 10A:
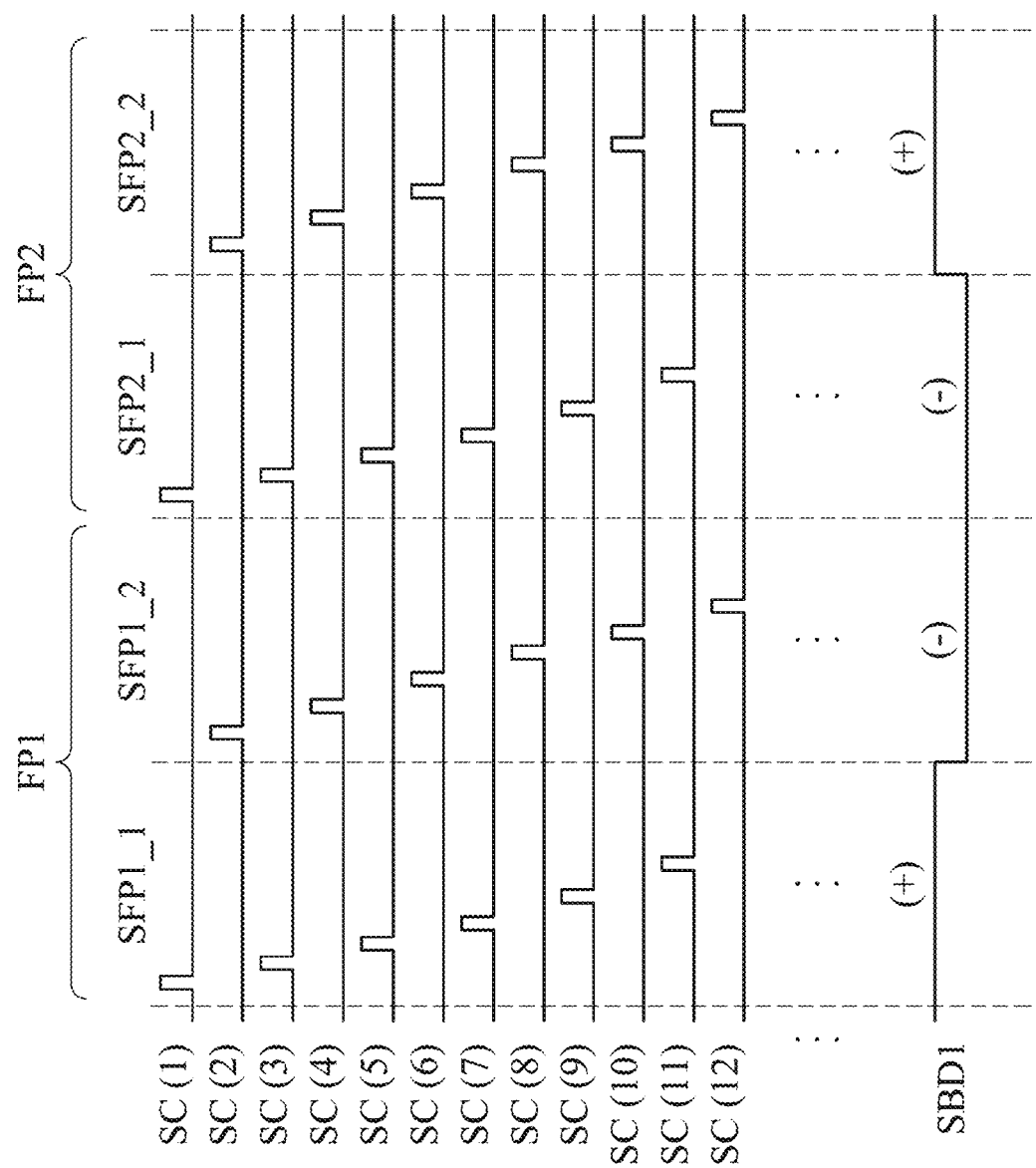
FIG. 10A is a timing sequence diagram of the scan signals and the pixel signals during two consecutive frame periods when performing a first-color image display test on the display apparatus shown in FIG. 1.

In the aforementioned embodiments, the pixel data of the pixel signals SBD1-SBD3 are respectively transmitted to the first to third subpixels PX1-PX3 to luminate the first to third subpixels PX1-PX3 to respectively display first to third colors. For example, when one, another and the other of the first to third colors are respectively red, green and blue, the touch display panel 110 displays a white color image (i.e. red color, green color and blue color are mixed to be a white color image), but the invention is not limited thereto. In another embodiment, when only the first subpixels PX1, the second subpixels PX2 or the third subpixels PX3 luminate, i.e., the touch display panel 110 displays an image of one of the first to third colors, the above embodiments of zero polarity number difference in a frame period may also be applied, such that the touch display panel 110 displays images normally without the roller shutter effect. FIG. 10A is a timing sequence diagram of the scan signals SC(1)-SC(N) and the pixel signals SBD1-SBD3 during two consecutive frame periods when performing a first-color image display test on the touch display device 100 shown in FIG. 1. FIG. 10A is similar to FIG. 9A, in which the same reference numerals are used, and thus the redundant details thereof will be omitted. Because the first subpixels PX1 luminate and the second and third subpixels PX2, PX3 do not luminate during the frame periods FP1, FP2 to display a first-color image, each data line of the first group of data lines DLA may receive pixel data of positive polarity during the subframe period SFP1_1, pixel data of negative polarity during the subframe period SFP1_2, pixel data of negative polarity during the subframe period SFP2_1 and pixel data of positive polarity during the subframe period SFP2_2, and each of the second and third groups of data lines DLB, DLC may not receive pixel signal during the frame periods FP1, FP2, but the invention is not limited thereto. In another embodiment, the voltages of the pixel signals SBD2, SBD3 transmitted to the second and third groups of data lines DLB, DLC may be equal to the common voltage Vcom during the frame periods FP1, FP2, such that the second and third subpixels PX2, PX3 do not luminate during the frame periods FP1, FP2. For convenient illustration, referring to FIGS. 1, 5, an example of 5760 subpixels PX1-PX3 corresponding to a touch sensing electrode SP (i.e. 5760 subpixels PX1-PX3 are disposed in an area of a touch sensing electrode SP when viewed in a direction perpendicular to the substrate 112 of the touch display device 100) is discussed below, but in this invention, the number of the subpixels corresponding to a touch sensing electrode SP is not limited thereto. Because a half of the scan lines SL(1)-SL(N) (i.e. SL(1), SL(3), SL(5), . . . ) and the other half of the scan lines SL(1)-SL(N) (i.e. SL(2), SL(4), SL(6), . . . ) are respectively enabled during the subframe periods SFP1_1, SFP1_2 of the frame period FP1 (i.e. a half and the other half of the subpixels in the active area of the touch display device are respectively enabled during the subframe period SFP1_1, SFP1_2 of the frame period FP1), the half and the other half of 5760 subpixels corresponding to one touch sensing electrode SP are respectively enabled during the subframe periods SFP1_1, SFP1_2 of the frame period FP1, therefore, the positive polarity pixel data of the first pixel signal SBD1 are transmitted to one-third of a half of 5760 subpixels corresponding to one touch sensing electrode SP (i.e. 5760×($\frac{1}{2}$)×($\frac{1}{3}$)=960 pixels) through some data lines of the first group of data lines DLA during the subframe period SFP1_1 of the frame period FP1, such that the polarity number difference (which equals to the number of positive polarity subpixels minus the number of negative polarity subpixels in an area of one touch sensing electrode) during the subframe period SFP1_1 of the frame period FP1 is 960; the negative polarity pixel data of the first pixel signal SBD1 are transmitted to one-third of the other half of 5760 subpixels corresponding to one touch sensing electrode SP (i.e. 5760×($\frac{1}{2}$)×($\frac{1}{3}$)=960 pixels) through some data lines of the first group of data lines DLA during the subframe period SFP1_2 of the frame period FP1, such that the polarity number difference (which equals to the number of positive-polarity subpixels minus the number of negative-polarity subpixels in an area of one touch sensing electrode) during the subframe period SFP1_2 of the frame period FP1 is −960. Therefore, the sum of the polarity number differences respectively in the subframes SFP1_1, SFP1_2 of the frame period FP1 is 960+(−960)=0, such that the touch display panel 110 displays the first-color image normally without the roller shutter effect. Similarly, the polarity number difference during the subframe period SFP2_1 of the frame period FP2 and the polarity number difference during the subframe period SFP2_2 of the frame period FP2 are −960 and 960, respectively, and the sum of the polarity number differences respectively in the subframes SFP2_1, SFP2_2 of the frame period FP2 is (−960)+960=0. In a variant embodiment, the first group of data lines DLA may receive pixel data of negative polarity, pixel data of positive polarity, pixel data of positive polarity and pixel data of negative polarity respectively during the subframe periods SFP1_1, SFP1_2, SFP2_1, SFP2_2, such that the sum of the polarity number differences respectively in the subframes SFP1_1, SFP1_2 of the frame period FP1 is 0, and the sum of the polarity number differences respectively in the subframes SFP2_1, SFP2_2 of the frame period FP2 is 0. By dividing a frame period into two subframe periods and enabling the sum of the polarity number differences respectively in the two subframes to be 0, the touch display panel 110 displays the first-color image normally without the roller shutter effect.

Figure 10B:
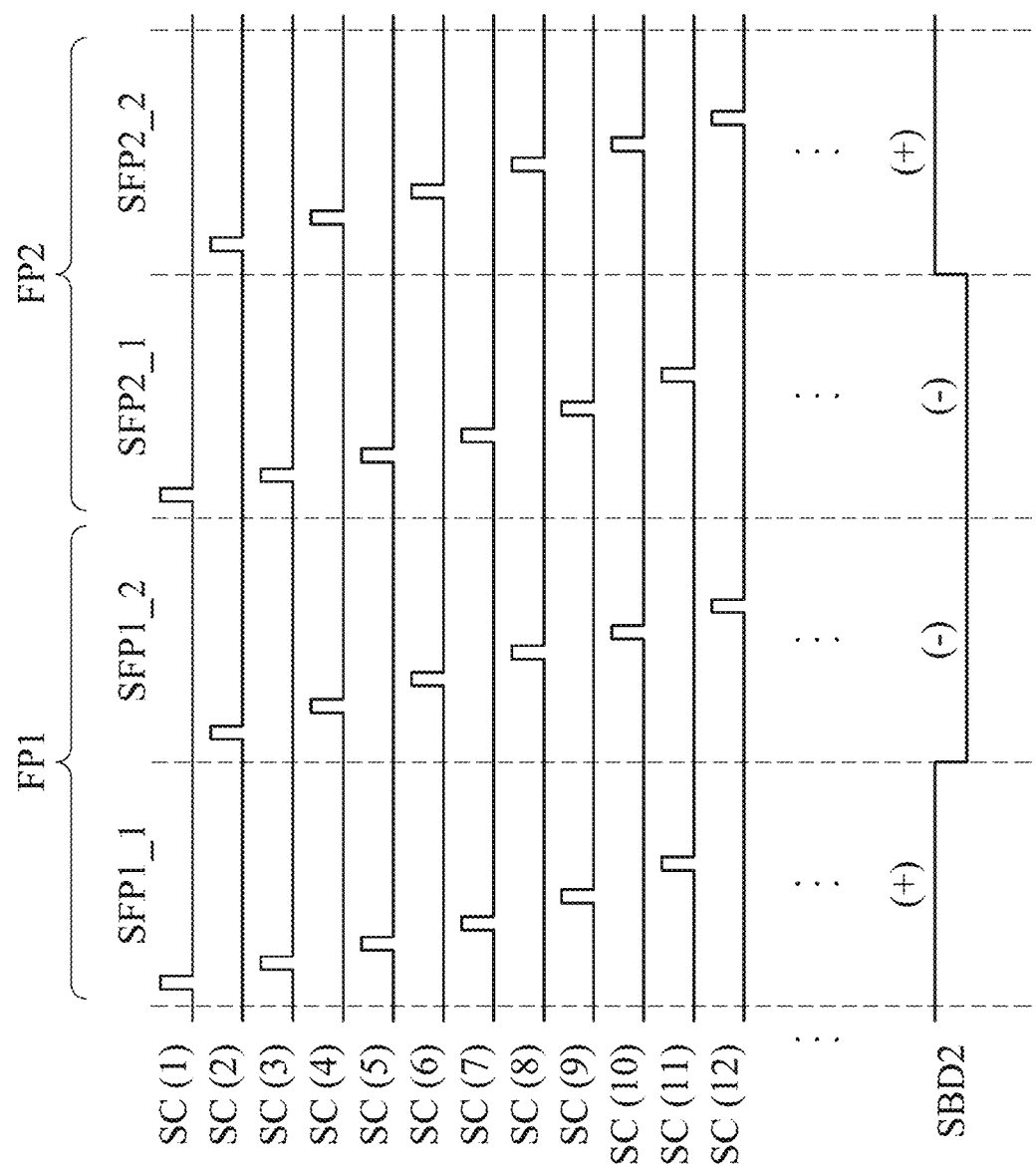
FIG. 10B is a timing sequence diagram of the scan signals and the pixel signals during two consecutive frame periods when performing a second-color image display test on the display apparatus shown in FIG. 1.
Figure 10C:
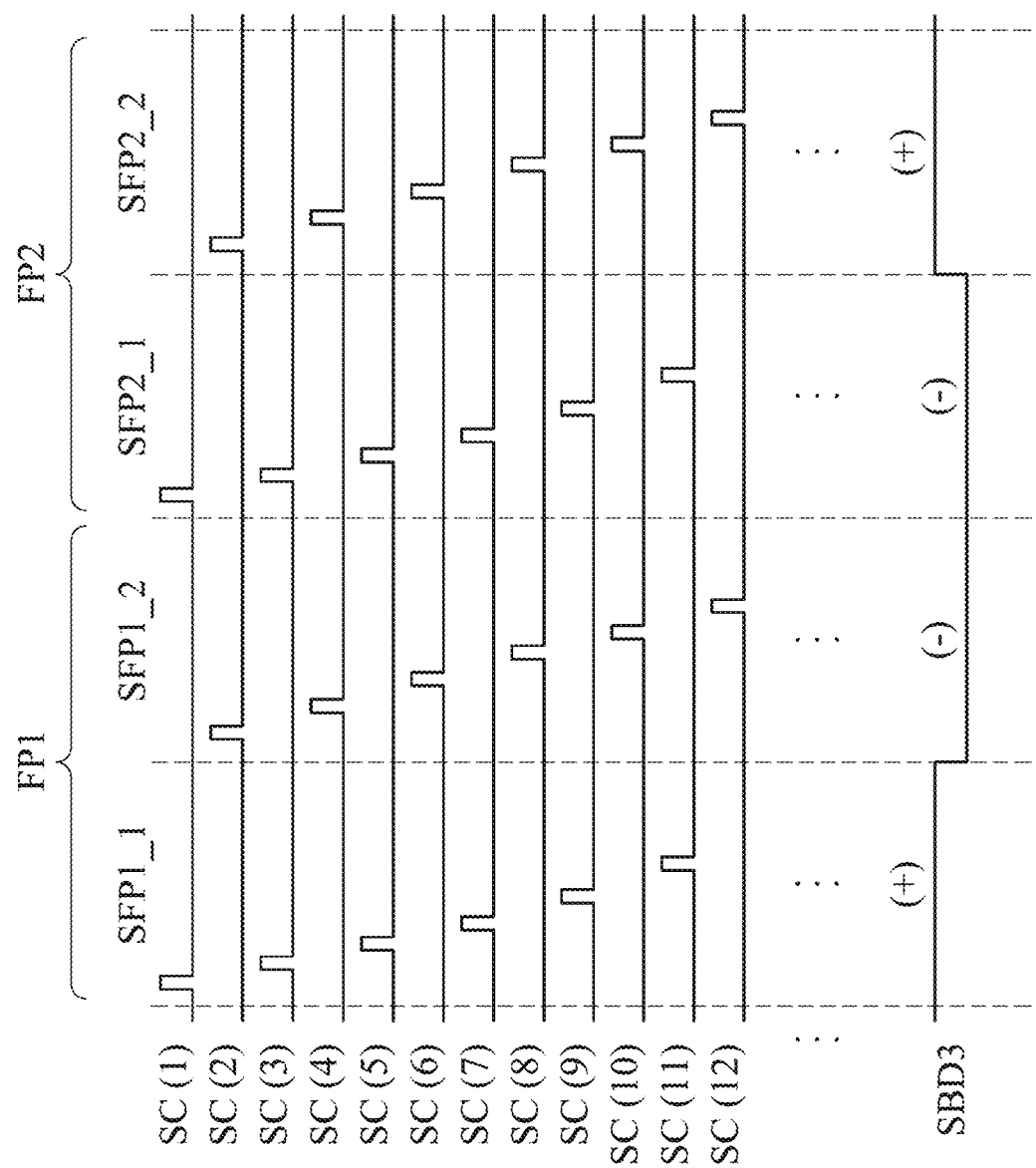
FIG. 10C is a timing sequence diagram of the scan signals and the pixel signals during two consecutive frame periods when performing a third-color image display test on the display apparatus shown in FIG. 1.

FIG. 10B is a timing sequence diagram of the scan signals SC(1)-SC(N) and the pixel signals SBD1-SBD3 during two consecutive frame periods when performing a second-color image display test on the touch display device 100 shown in FIG. 1, and FIG. 10C is a timing sequence diagram of the scan signals SC(1)-SC(N) and the pixel signals SBD1-SBD3 during two consecutive frame periods when performing a third-color image display test on the touch display device 100 shown in FIG. 1. The difference between FIG. 10A and FIG. 10B is that, in FIG. 10B, because the second subpixels PX2 luminate and the first and third subpixels PX1, PX3 do not luminate during the frame periods FP1, FP2 to display a second-color image, each data line of the second group of data lines DLB may receive pixel data of positive polarity, pixel data of negative polarity, pixel data of negative polarity and pixel data of positive polarity respectively during the subframe periods SFP1_1, SFP1_2, SFP2_1, SFP2_2 of the two consecutive frame periods FP1, FP2, such that the sum of the polarity number differences respectively in the subframes SFP1_1, SFP1_2 of the frame period FP1 and the sum of the polarity number differences respectively in the subframes SFP2_1, SFP2_2 of the frame period FP2 are 0, and each of the second and third groups of data lines DLA, DLC may not receive pixel signal during the frame periods FP1, FP2, but the invention is not limited thereto. In another embodiment, the voltages of the pixel signals SBD1, SBD3 transmitted to the second and third groups of data lines DLA, DLC may be equal to the common voltage Vcom during the frame periods FP1, FP2, such that the first and third subpixels PX1, PX3 do not luminate during the frame periods FP1, FP2. In a variant embodiment, each data line of the second group of data lines DLB may receive pixel data of negative polarity, pixel data of positive polarity, pixel data of positive polarity and pixel data of negative polarity respectively during the subframe periods SFP1_1, SFP1_2, SFP2_1, SFP2_2 of the two consecutive frame periods FP1, FP2, such that the sum of the polarity number differences respectively in the subframes SFP1_1, SFP1_2 of the frame period FP1 is 0, and the sum of the polarity number differences respectively in the subframes SFP2_1, SFP2_2 of the frame period FP2 is 0. Similarly, the difference between FIG. 10A and FIG. 10C is that, in FIG. 10C, because the third subpixels PX3 luminate and the first and second subpixels PX1, PX2 do not luminate during the frame periods FP1, FP2 to display a third-color image, each data line of the third group of data lines DLC may receive pixel data of positive polarity, pixel data of negative polarity, pixel data of negative polarity and pixel data of positive polarity respectively during the subframe periods SFP1_1, SFP1_2, SFP2_1, SFP2_2 of the two consecutive frame periods FP1, FP2, such that the sum of the polarity number differences respectively in the subframes SFP1_1, SFP1_2 of the frame period FP1 and the sum of the polarity number differences respectively in the subframes SFP2_1, SFP2_2 of the frame period FP2 are 0, and each of the second and third groups of data lines DLA, DLB may not receive pixel signal during the frame periods FP1, FP2, but the invention is not limited thereto. In another embodiment, the voltages of the pixel signals SBD1, SBD2 transmitted to the second and third groups of data lines DLA, DLB may be equal to the common voltage Vcom during the frame periods FP1, FP2, such that the first and second subpixels PX1, PX2 do not luminate during the frame periods FP1, FP2. In a variant embodiment, each data line of the third group of data lines DLC may receive pixel data of negative polarity, pixel data of positive polarity, pixel data of positive polarity and pixel data of negative polarity respectively during the subframe periods SFP1_1, SFP1_2, SFP2_1, SFP2_2 of the two consecutive frame periods FP1-FP2, such that the sum of the polarity number differences respectively in the subframes SFP1_1, SFP1_2 of the frame period FP1 is 0, and the sum of the polarity number differences respectively in the subframes SFP2_1, SFP2_2 of the frame period FP2 is 0.

To summarize, when the touch display panel 110 displays a first-color image, because the first subpixels PX1 are coupled to the first group of data lines DLA, the first group of data lines DLA receives pixel data of first polarity, pixel data of second polarity, pixel data of second polarity and pixel data of first polarity respectively during the subframe periods SFP1_1, SFP1_2, SFP2_1, SFP2_2 of the two consecutive frame periods FP1, FP2. The first and second polarities are respectively positive polarity and negative polarity, or respectively negative polarity and positive polarity. Likewise, when the touch display panel 110 displays a second color image or a third color image, because the second and third subpixels PX2, PX3 are respectively coupled to the second and third groups of data lines DLB, DLC, the second group of data lines DLB may receive pixel data of first polarity, pixel data of second polarity, pixel data of second polarity and pixel data of first polarity respectively during the subframe periods SFP1_1, SFP1_2, SFP2_1, SFP2_2 of the two consecutive frame periods FP1, FP2, in which the first and second polarities are respectively positive polarity and negative polarity, or respectively negative polarity and positive polarity, so as to display a second color image; or the third group of data lines DLC may receive pixel data of first polarity, pixel data of second polarity, pixel data of second polarity and pixel data of first polarity in sequence respectively during the subframe periods SFP1_1, SFP1_2, SFP2_1, SFP2_2 of the two consecutive frame periods FP1-FP2, in which the first and second polarities are respectively positive polarity and negative polarity, or respectively negative polarity and positive polarity, so as to display a third color image.

In the embodiment of FIGS. 1 and 3, the display panel 110 includes first to third subpixels PX1-PX3, the first to third groups of data lines DLA-DLC, scan lines SL(1)-SL(N) and the test pads SBP1-SBP3 (which may also be referred to as first to third test pads), the first to third subpixels PX1-PX3 are configured to respectively display first to third colors, the first to third groups of data lines DLA-DLC respectively include data lines DL(3K−2), DL(3K−1), DL(3K), in which K is an integer greater than or equal to 1, and the first to third groups of data lines DLA-DLC are electrically connected to the first to third subpixels PX1-PX3, respectively. When performing an image test on the touch display panel 110, the thin film transistors SW(1)-SW(M) are turned on, therefore, the test pads SBP1-SBP3 are electrically connected to the first to third groups of data lines DLA-DLC, respectively, and the pixel signals SBD1-SBD3 (which may also be referred to as first to three pixel signals) may be transmitted to the first to third groups of data lines DLA-DLC respectively through the test pads SBP1-SBP3. In the embodiment, a frame period FP1 may be divided into two subframe periods SFP1_1, SFP1_2, a frame period FP2 may be divided into two subframe periods SFP2_1, SFP2_2, a half of the scan lines SL(1)-SL(N) are enabled during the subframe period SFP1_1 of the frame period FP1 and the subframe period SFP2_1 of the frame period FP2, and the other half of the scan lines SL(1)-SL(N) are enabled during the subframe period SFP1_2 of the frame period FP1 and the subframe period SFP2_2 of the frame period FP2. During the two consecutive frame periods FP1, FP2, two of the first to third groups of data lines DLA-DLC may receive pixel data of first polarity, pixel data of second polarity, pixel data of second polarity and pixel data of first polarity in sequence respectively during the subframe periods SFP1_1, SFP1_2, SFP2_1, SFP2_2, and the other one of the first to third groups of data lines DLA-DLC may receive pixel data of second polarity, pixel data of first polarity, pixel data of first polarity and pixel data of second polarity in sequence respectively during the subframe periods SFP1_1, SFP1_2, SFP2_1, SFP2_2, in which the first and second polarities are respectively positive polarity and negative polarity, or respectively negative polarity and positive polarity, such that the sum of the polarity number differences respectively in the subframe periods SFP1_1, SFP1_2 of the frame period FP1 is 0, and the sum of the polarity number differences respectively in the subframe periods SFP2_1, SFP2_2 of the frame period FP2 is 0, but the invention is not limited thereto. Summing up the above, the touch display panel includes first to third subpixels, N number of scan lines, first to third groups of data lines and first to third test pads, the first to third subpixels are respectively first-color subpixels, second-color subpixels and third-color subpixels, and the first to third groups of data lines are respectively electrically connect to the first to third subpixels. When performing an image display test on the touch display panel, the first to third test pads are electrically connected to the first to third group of data lines, respectively, and the first to third pixel data may be transmitted to the first to third groups of data lines respectively through the first to third test pads. The display period of the touch display panel includes a first frame period and a second frame period, the first frame period and the second frame period are consecutive, and the first frame period is previous to the second frame period. Each of the first and second frame periods includes a first subframe period and a second subframe period. In the first frame period, the first subframe period is prior to the second subframe period; in the second frame period, the first subframe period is prior to the second subframe period. A half of the N number of scan lines are enabled during the first subframe period of the first frame period (e.g., subframe period SFP1_1 of frame period FP1) and the first subframe period of the second frame period (e.g., subframe period SFP2_1 of frame period FP2), and the other half of the N number of scan lines are enabled during the second subframe period of the first frame period (e.g., subframe period SFP1_2 of frame period FP1) and the second subframe period of the second frame period (e.g., subframe period SFP2_2 of frame period FP2). Each pixel unit includes first to third subpixels which are configured to display first to third colors, respectively. When performing an image display test on the touch display panel, for example, the first to third subpixels of the touch display panel luminate to display the image (e.g. red color subpixels, green color subpixels and blue color subpixels of the touch display panel luminate to display a white color image) on the touch display panel, two of the first to third groups of data lines may receive pixel data of first polarity, pixel data of second polarity, pixel data of second polarity and pixel data of first polarity in sequence respectively during the first and second subframe periods of the first frame period and the first and second subframe periods of the second frame period, and the other one of the first to third groups of data lines may receive pixel data of second polarity, pixel data of first polarity, pixel data of first polarity and pixel data of second polarity in sequence respectively during the first and second subframe periods of the first and second frame periods. The first and second polarities are respectively positive polarity and negative polarity, or respectively negative polarity and positive polarity. When performing a first-color, second-color or third color image display test on the touch display panel, for example, only the first subpixels, the second subpixels or the third subpixels of the touch display panel luminate to display the image (e.g. red color subpixel of each pixel unit luminates, and green color and blue color subpixels of each pixel unit do not luminate to display a red color image; green color subpixel of each pixel unit luminates, and red color and blue color subpixels of each pixel unit do not luminate to display a blue color image; or blue color subpixel of each pixel unit luminates, and red color and green color subpixels of each pixel unit do not luminate to display a blue color image) on the touch display panel, one of the first to third groups of data lines may receive pixel data of first polarity, pixel data of second polarity, pixel data of second polarity and pixel data of first polarity respectively during the first and second subframe periods of the first frame period and first and second subframe periods of the second frame period, and each of the other two of the first to third groups of data lines may not receive pixel signal during the first and second frame periods. The first and second polarities are respectively positive polarity and negative polarity, or respectively negative polarity and positive polarity.

It is noted that in the above embodiments and variant embodiments, the polarity of each subpixel needs to be inverted in two consecutive frame periods, and therefore the same group of data lines may receive pixel data of first polarity, pixel data of second polarity, pixel data of second polarity and pixel data of first polarity in sequence respectively during the subframe periods SFP1_1, SFP1_2, SFP2_1, SFP2_2, or may receive pixel data of second polarity, pixel data of first polarity, pixel data of first polarity and pixel data of second polarity respectively during the subframe periods SFP1_1, SFP1_2, SFP2_1, SFP2_2. However, the invention is not limited thereto. In an embodiment where the polarity of each subpixel in the touch display panel 110 does not need to be inverted in two consecutive frame periods, the same group of data lines may receive pixel data of first polarity, pixel data of second polarity, pixel data of first polarity and pixel data of second polarity in sequence respectively during the subframe periods SFP1_1, SFP1_2, SFP2_1, SFP2_2, or may receive pixel data of second polarity, pixel data of first polarity, pixel data of second polarity and pixel data of first polarity in sequence respectively during the subframe periods SFP1_1, SFP1_2, SFP2_1, SFP2_2, such that the sum of the polarity number differences respectively in the subframe periods SFP1_1, SFP1_2 of the frame period FP1 is also 0, and the sum of the polarity number differences respectively in the subframe periods SFP2_1, SFP2_2 of the frame period FP2 is also 0.

Summing the above, the invention provides a method of testing a touch display panel that includes a substrate, touch sensing electrodes and subpixels, in which the touch sensing electrodes and the subpixels are disposed over the substrate, and each of at least some of the touch sensing electrodes is overlapped with the area of corresponding X number of subpixels in a direction perpendicular to the substrate, where X is an integer greater than or equal to 2, i.e., the common electrodes of the X number of subpixels are electrically connected to form one of the touch sensing electrodes, and the method includes: dividing a frame period of an image into subframe periods that include a first subframe period and a second subframe period; transmitting pixel data to some of the X number of subpixels (e.g. a half of the X number of subpixels) in the first subframe period, in which the number of positive polarity subpixels (i.e. subpixels receiving pixel data of positive polarity) of the some of the X number of subpixels subtracted by the number of negative polarity subpixels (i.e. subpixels receiving pixel data of negative polarity) of the some of the X number of subpixels is defined as a first polarity number difference; and transmitting pixel data to others of the X number of subpixels (e.g. the other half of the X number of subpixels) in the second subframe period, in which the number of positive polarity subpixels of the others of the X number of subpixels subtracted by the number of negative polarity subpixels of the others of the X subpixels is defined as a second polarity number difference, and the sum of the first and second polarity number differences is 0. In some embodiments of the invention, the number of the some of the X number of subpixels is X/2, and the number of the others of the X number of subpixels is X/2. In some embodiments of the invention, the touch display panel further includes scan lines, in which odd-numbered scan lines are enabled in the first subframe period, and even-numbered scan lines of the plurality of scan lines are enabled in the second subframe period. In some embodiments of the invention, the X number of subpixels includes first subpixels that are used to display a first color; some of the first subpixels of the X number of subpixels receive pixel data of positive polarity during the first subframe period, and others of the first subpixels of the X number of subpixels receive pixel data of negative polarity during the second subframe period. In some embodiments of the invention, the X number of subpixels includes Y number of first subpixels, where Y is an integer less X, the number of the some of the first subpixels of the X number of subpixels is Y/2, and the number of the others of the first subpixels of the X number of subpixels is Y/2. In some embodiments of the invention, the method further includes dividing another frame period into subframe periods that include a third subframe period and a fourth subframe period, the frame period and the another frame period are consecutive, the another frame period is subsequent to the frame period, the second subframe period is subsequent to the first subframe period, the fourth subframe period is subsequent to the third subframe period, the some of the first subpixels receive pixel data of negative polarity during the third subframe, and the others of the first subpixels receive pixel data of positive polarity during the fourth subframe. In some embodiments of the invention, the X number of subpixels further includes second subpixels and third subpixels that are used to display a second color and a third color, respectively; some of the second subpixels receive pixel data of positive polarity during the first subframe period, others of the second subpixels receive pixel data of negative polarity during the second subframe period, some of the third subpixels receive pixel data of negative polarity during the first subframe period, and others of the third subpixels receive pixel data of negative polarity during the second subframe period. In some embodiments of the invention, the X number of subpixels includes Y number of second subpixels and Y number of third subpixels, where Y is equal to X/3, X is a positive multiple of 3, and the number of the some of the second subpixels, the number of the others of the second subpixels, the number of the some of the third subpixels and the number of the others of the third subpixels are Y/2. In some embodiments of the invention, each subpixel includes a common electrode, and each touch sensing electrode includes common electrodes of the X number of subpixels (i.e., the common electrodes of the X number of subpixels are electrically connected to form one of the touch sensing electrodes). In some embodiments of the invention, each subpixel further includes a pixel electrode that is disposed over or under the common electrode, and at least one insulating layer is between the pixel electrode and the common electrode.

Figure 11A:
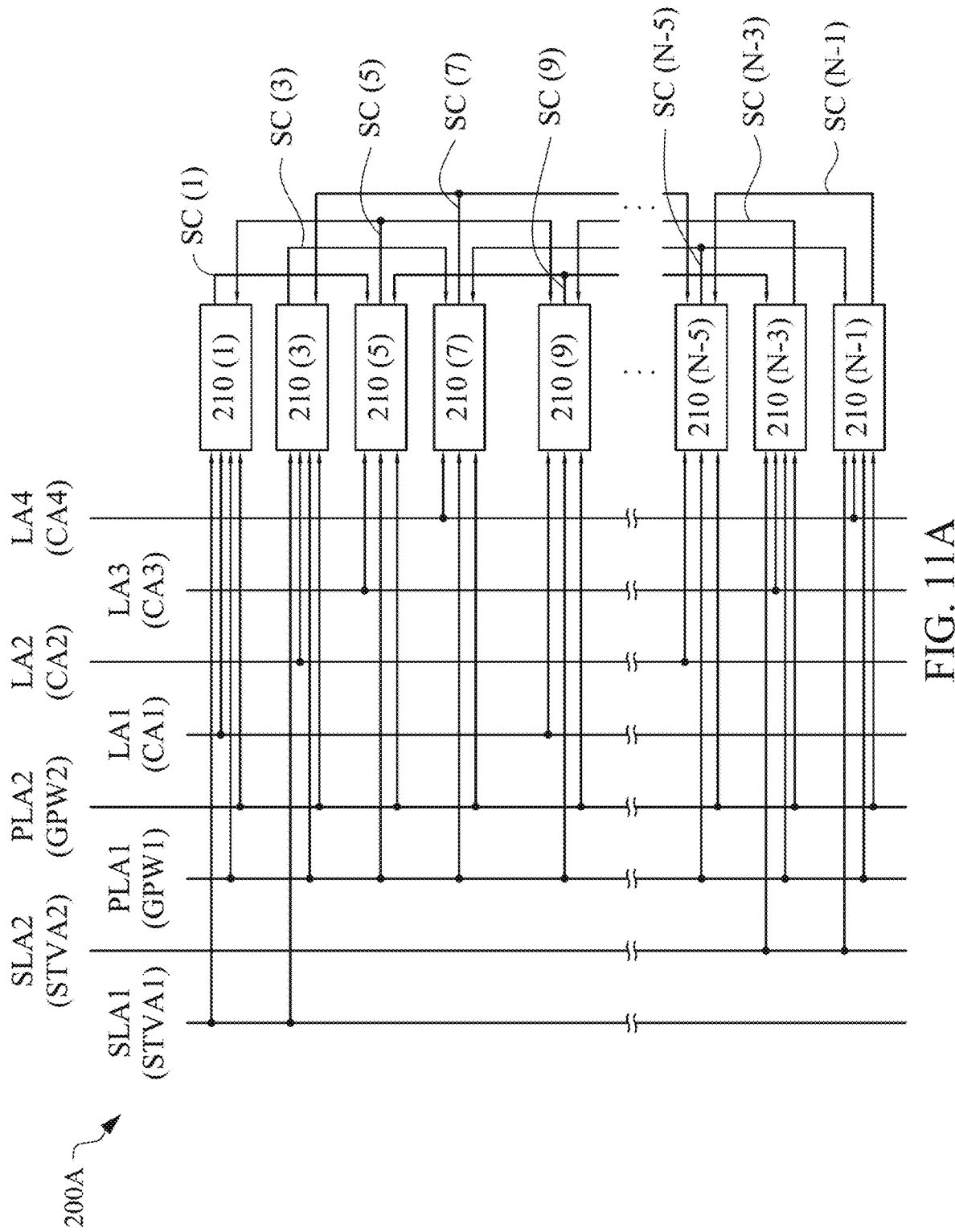
FIGS. 11A-11B are respective schematic diagrams of gate driving circuits in accordance with some embodiments of the invention.
Figure 11B:
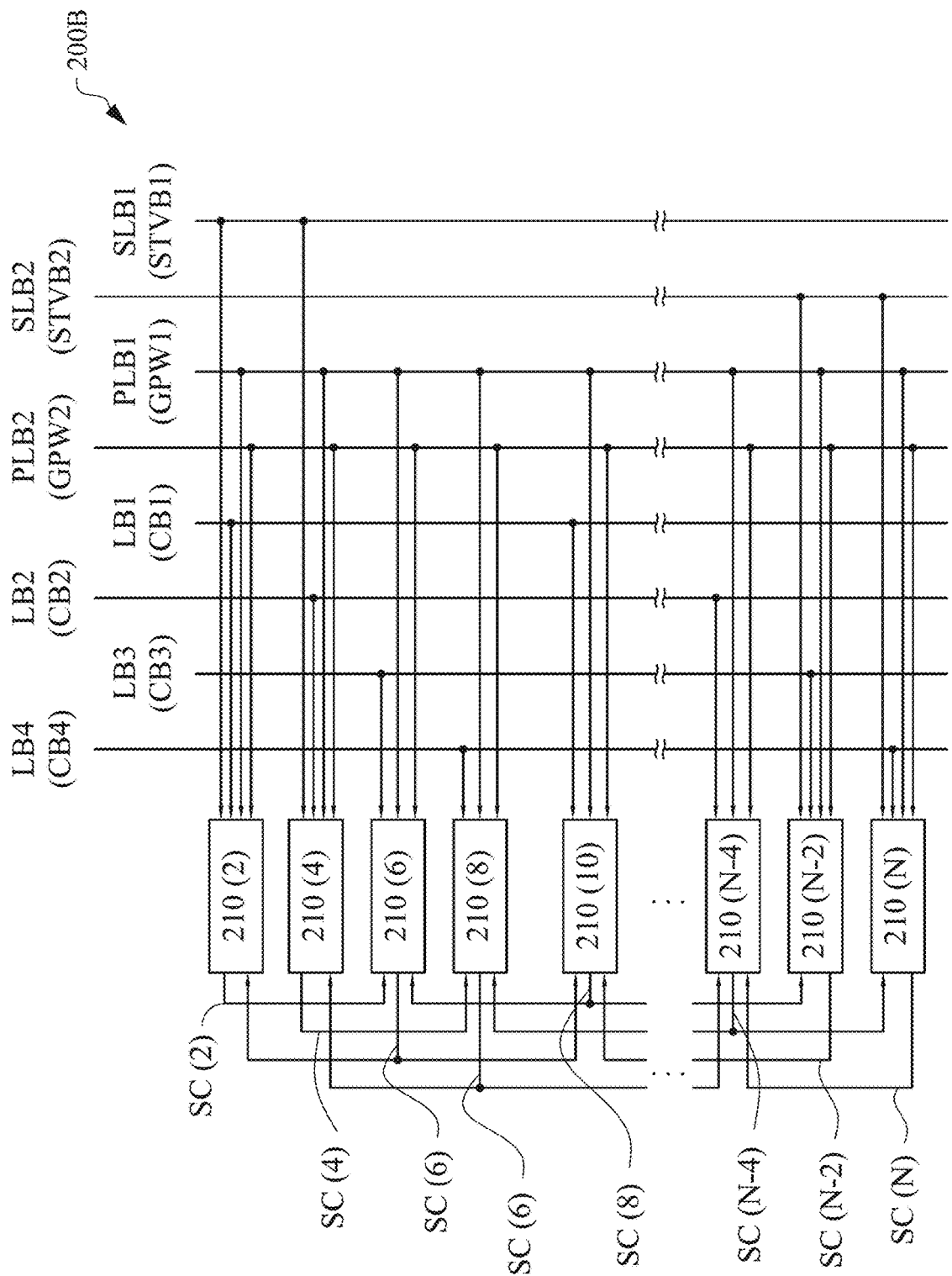

FIGS. 11A-11B are respective schematic diagrams of gate driving circuits 200A and 200B in accordance with some embodiments of the invention. The gate driving circuits 200A, 200B may be an exemplary example of the gate driving circuits 120A, 120B in FIG. 1, and may be a gate driver on array (GOA) structure that is disposed on the substrate 112 of the display panel 110.

As shown in FIG. 11A, the gate driving circuit 200A includes clock signal lines LA1-LA4, a first control signal line SLA1, a second control signal line SLA2, pull-down control signal lines PLA1 and PLA2 and odd stage shift registers 210(1), 210(3), ..., 210(N−1), and as shown in FIG. 11B, the gate driving circuit 200B includes clock signal lines LB1-LB4, a first control signal line SLB1, a second control signal line SLB2, pull-down control signal lines PLB1 and PLB2 and even stage shift registers 210(2), 210(4), ..., 210(N), where N is an even number greater than 9. In some embodiments, N is a multiple of 8. In FIGS. 11A, 11B, names in parentheses designate signals transmitted in the signal lines. For example, CA1 of LA1(CA1) represents a clock signal CA1 transmitted in the clock signal line LA1. The clock signal lines LA1-LA4 are configured to respectively provide clock signals CA1-CA4 to the shift registers 210(8K−7), 210(8K−5), 210(8K−3), 210(8K−1), and the clock signal lines LB1-LB4 are configured to respectively provide clock signals CB1-CB4 to the shift registers 210 (8K−6), 210(8K−4), 210(8K−6), 210(8K), where K is an integer greater than or equal to 1. For example, The clock signal line LA1 is configured to provide the clock signal CA1 to the shift registers 210(1), 210(9), 210(17), .... The pull-down control signal lines PLA1 and PLA2 are configured to respectively provide pull-down control signals GPW1 and GPW2 to each of the odd stage shift registers 210(1), 210(3), ..., 210(N−1), the pull-down control signal lines PLB1, PLB2 are configured to respectively provide the pull-down control signals GPW1, GPW2 to each of the even stage shift registers 210(2), 210(4), ..., 210(N). In addition, the first control signal line SLA1 provides a first control signal STVA1 to the $1^{st}$ and $3^{rd}$ stage shift registers 210(1), 210(3), the first control signal line SLB1 provides a first control signal STVB1 to the $2^{nd}$ and $4^{th}$ stage shift registers 210(2), 210(4), the second control signal line SLA2 provides a second control signal STVA2 to the $(N−3)^{th}$ and $(N−1)^{th}$ stage shift registers 210(N−3), 210(N−1), and the second control signal line SLB2 provides a second control signal STVB2 to the $(N−2)^{th}$ and $N^{th}$ stage shift registers 210(N−2), 210(N). The shift registers 210(1)-210(N) respectively generate scan signals SC(1)-SC(N), in which the scan signals SC(1)-SC(4) are respectively inputted to the $5^{th}$-$8^{th}$ stage shift registers 210(5)-210(8), the scan signals SC(N−3)-SC(N) are respectively inputted to the $(N−7)^{th}$-$(N−4)^{th}$ stage shift registers 210(N−7)-210(N−4), and scan signal SC(j) of the other scan signals SC(5)-SC(N−4) is inputted to the $(j−4)^{th}$ stage shift register 210(j−4) and the $(j+4)^{th}$ stage shift register 210(j+4), where j is an integer greater than or equal to 5 and less than or equal to (N−4). For example, the scan signal SC(5) is inputted to the $1^{st}$ stage shift register 210(1) and the $9^{th}$ stage shift register 210(9).

Figure 12:
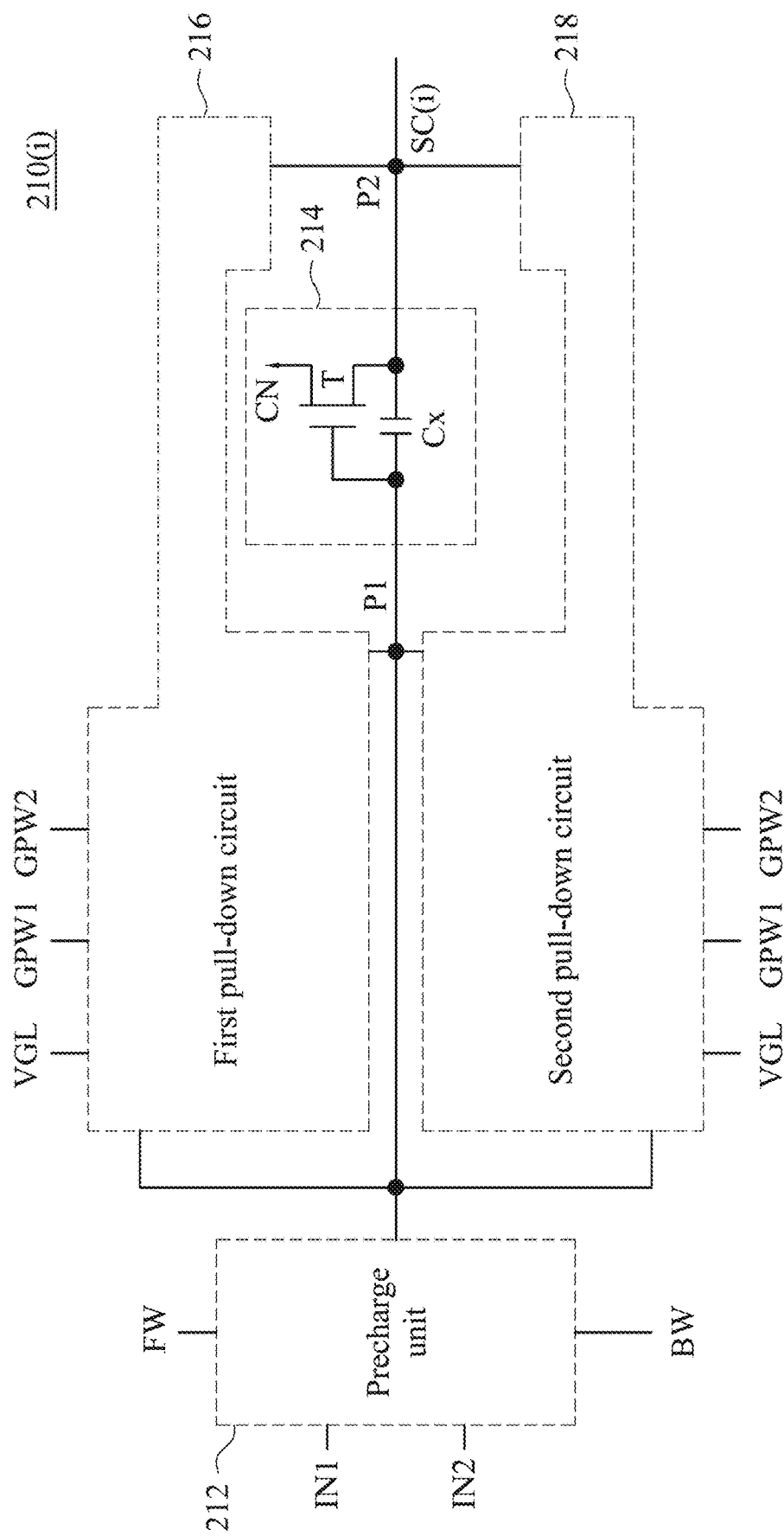
FIG. 12 is s circuit block diagram of an $i^{th}$ stage shift register of the gate driving circuits in FIGS. 10A-10B.

FIG. 12 is s circuit block diagram of the $i^{th}$ stage shift register 210(i) of the gate driving circuits 200A, 200B in FIGS. 11A-11B, where i is an integer from 1 to N. The $i^{th}$ stage shift register 210(i) includes a precharge unit 212, a pull-up unit 214, a first pull-down unit 216 and a second pull-down unit 218.

The precharge unit 212 receives input signals IN1 and IN2, and outputs a precharge signal through the node P1 based on the input signals IN1 and IN2. In addition, the precharge unit 212 further receives a forward input signal FW and a backward input signal BW, such that the gate driving circuit 200 drives the pixels in the active area AA sequentially according to the forward input signal FW and the backward input signal BW. The forward input signal FW and the backward input signal BW are phase-inverted during the display period of the touch display panel, and the gate driving circuits 200A, 200B may perform bi-directional scanning according to voltage levels of the forward input signal FW and the backward input signal BW. For example, the voltage levels of the forward input signal FW and the backward input signal BW may respectively be enabling voltage level (e.g. high voltage level) and disabling voltage level (e.g. low voltage level) during a frame period of the display period of the touch display panel for forward scanning, and the voltage levels of the forward input signal FW and the backward input signal BW may respectively be disabling voltage level (e.g. low voltage level) and enabling voltage level (e.g. high voltage level) during another frame period of the display period of the touch display panel for backward scanning. In a case where i is odd, if the shift register 210(i) is the $1^{st}$ or $3^{rd}$ stage shift register (i.e. i is 1 or 3), the input signal IN1 is the first control signal STVA1, and the input signal IN2 is the scan signal SC(i+4) outputted by the $(i+4)^{th}$ stage shift register 210(i+4); if the shift register 210(i) is the $5^{th}$, $7^{th}$, ... or $(N-5)^{th}$ stage shift register (i.e. i is 5, 7, ... or N-5), the input signal IN1 is the scan signal SC(i-4) outputted by the $(i-4)^{th}$ stage shift register 210(i-4), and the input signal IN2 is the scan signal SC(i+4) outputted by the $(i+4)^{th}$ stage shift register 210(i+4); if the shift register 210(i) is the $(N-3)^{th}$ or $(N-1)^{th}$ stage shift register (i.e. i is N-3 or N-1), the input signal IN1 is the scan signal SC(i-4) outputted by the $(i-4)^{th}$ stage shift register 210(i-4), and the input signal IN2 is the second control signal STVA2.

In a case where i is even, if the shift register 210(i) is the $2^{nd}$ or $4^{th}$ stage shift register (i.e. i is 2 or 4), the input signal IN1 is the first control signal STVB1, and the input signal IN2 is the scan signal SC(i+4) outputted by the $(i+4)^{th}$ stage shift register 210(i+4); if the shift register 210(i) is the $6^{th}$, $8^{th}$, ..., or $(N-4)^{th}$ stage shift register (i.e. i is 6, 8, ..., or N-4), the input signal IN1 is the scan signal SC(i-4) outputted by the $(i-4)^{th}$ stage shift register 210(i-4), and the input signal IN2 is the scan signal SC(i+4) outputted by the $(i+4)^{th}$ stage shift register 210(i+4); if the shift register 210(i) is the $(N-2)^{th}$ or $N^{th}$ stage shift register (i.e. i is N-2 or N), the input signal IN1 is the scan signal SC(i-4) outputted by the $(i-4)^{th}$ stage shift register 210(i-4), and the input signal IN2 is the second control signal STVB2.

Figure 13:
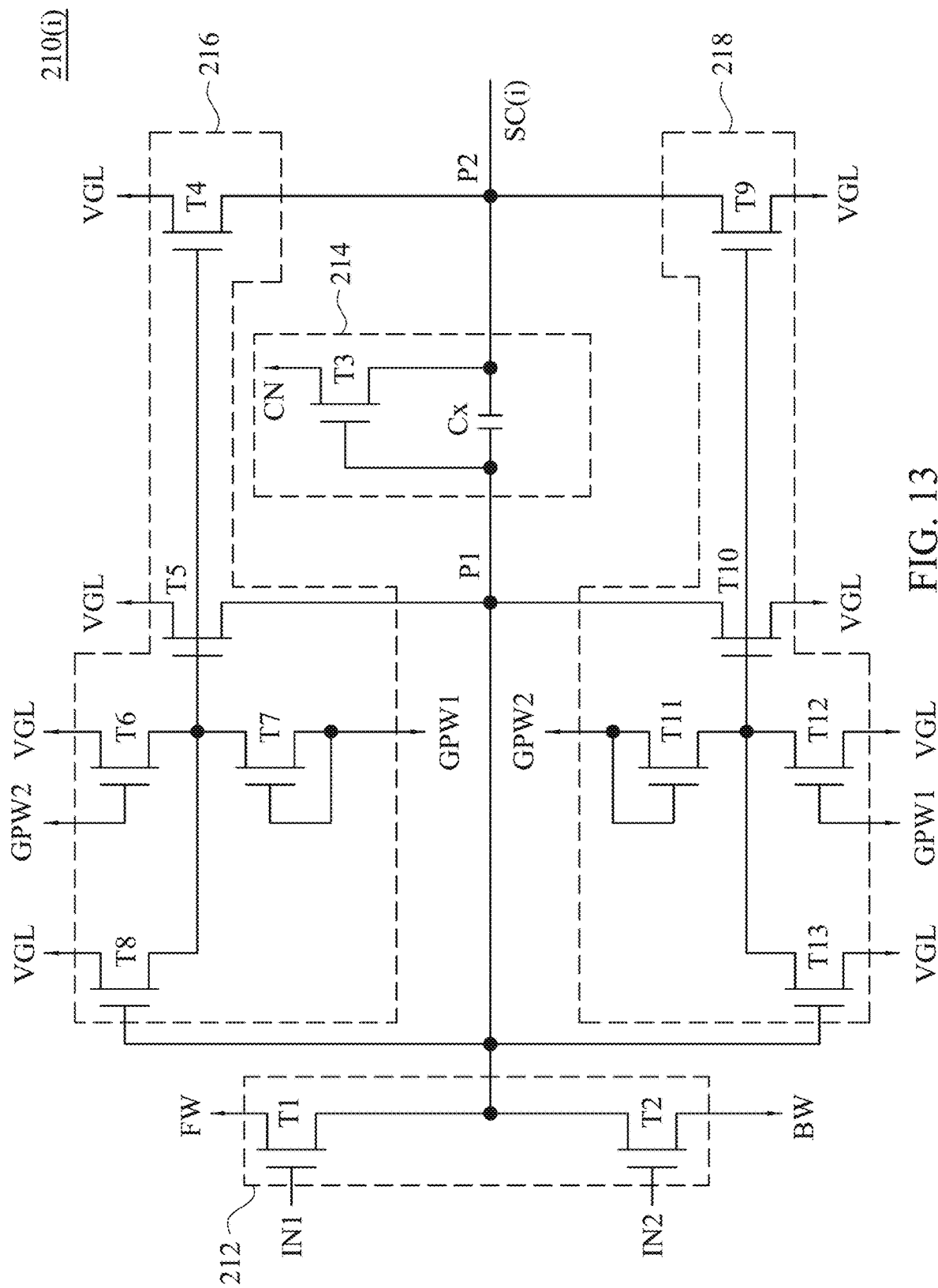
FIG. 13 is an example of the circuit diagram in the circuit block diagram of the $i^{th}$ stage shift register in FIG. 12.

FIG. 13 is an example of the circuit diagram in the circuit block diagram of the $i^{th}$ stage shift register 210(i) in FIG. 12. As shown in FIG. 13, the precharge unit 212 may include transistors T1, T2, in which the first terminals of the transistors T1, T2 are coupled to each other, the control terminal and the second terminal of the transistor T1 respectively receive the input signal IN1 and the forward input signal FW, and the control terminal and the second terminal of the transistor T2 respectively receive the input signal IN2 and the backward input signal BW. However, the circuit of the precharge unit 212 in the invention is not limited thereto. In the context, "control terminal," "first terminal" and "second terminal" of the transistor are respectively the gate, the source and the drain of the transistor, or alternatively respectively the gate, the drain and the source of the transistor.

The pull-up unit 214 is coupled to the precharge unit 212, and is configured to receive the precharge signal and a clock signal CN to output the scan signal SC(i) to the node P2 based on the precharge signal and the clock signal CN, in which the clock signal CN is one of the clock signals CA1-CA4, CB1-CB4. The pull-up unit 214 includes a transistor T3 and a capacitor Cx. The control terminal of the transistor T3 receives the precharge signal, the first terminal of the transistor T3 receives the clock signal CN, and the second terminal of the transistor T3 outputs the scan signal SC(i). The two terminals of the capacitor Cx are respectively coupled to the control terminal and the second terminal of the transistor T3.

The first pull-down unit 216 is coupled to the precharge unit 212 and the pull-up unit 214, and receives the precharge signal and the pull-down control signals GPW1, GPW2 to control whether to pull down the scan signal SC(i) to a reference voltage level VGL. The first pull-down unit 216 keeps the scan signal SC(i) at the reference voltage level VGL after pulling down the scan signal SC(i) to the reference voltage level VGL.

For example, the first pull-down unit 216 may include transistors T4-T8, in which the control terminals of the transistors T4, T5 and the first terminals of the transistors T6, T7, T8 are coupled to each other, the first and second terminals of the transistor T4 are respectively coupled to the node P2 and the reference voltage level VGL, the first and second terminals of the transistor T5 are respectively coupled to the node P1 and the reference voltage level VGL, the control terminal of the transistor T6 receives the pull-down control signal GPW2, the second terminal of the transistor T6 is coupled to the reference voltage level VGL, the control terminal and the second terminal of the transistor T7 are coupled to each other and receive the pull-down control signal GPW1, and the control terminal and the second terminal of the transistor T8 are respectively coupled to the node P1 and the reference voltage level VGL. However, the circuit of the first pull-down unit 216 in the invention is not limited thereto.

The second pull-down unit 218 is coupled to the precharge unit 212 and the pull-up unit 214, and receives the precharge signal and the pull-down control signals GPW1 and GPW2 to control whether to pull down the scan signal SC(i) to the reference voltage level VGL. The second pull-down unit 218 keeps the scan signal SC(i) at the reference voltage level VGL after pulling down the scan signal SC(i) to the reference voltage level VGL.

For example, the second pull-down unit 218 may include transistors T9-T13, in which the control terminals of the transistors T9, T10 and the first terminals of the transistors T11-T13 are coupled to each other, the first and second terminals of the transistor T9 are respectively coupled to the node P2 and the reference voltage level VGL, the first and second terminals of the transistor T10 are respectively coupled to the node P1 and the reference voltage level VGL, the control terminal and the second terminal of the transistor T11 are coupled to each other and receive the pull-down control signal GPW2, the control terminal and the second terminal of the transistor T12 are respectively coupled to the pull-down control signal GPW1 and the reference voltage level VGL, and the control terminal and the second terminal of the transistor T13 are respectively coupled to the node P1 and the reference voltage level VGL. However, the circuit of the second pull-down unit 218 in the invention is not limited thereto.

It is noted that the circuit block diagram of the $i^{th}$ stage shift register 210(i) of the gate driving circuits 200A, 200B in the invention is not limited to that in the aforementioned embodiment in FIG. 12. For example, In some embodiments, the number of pull-down unit of the $i^{th}$ stage shift register 210(i) in the gate driving circuits 200A and 200B may be only one.

In this context, the first to third subpixels PX1-PX3 may be a combination of red, green and blue subpixels that are respectively arranged for displaying three different colors of red, green and blue, but the invention is not limited thereto. For example, the first to third subpixels PX1-PX3 may respectively be red, green and blue subpixels, or respectively be green, blue and red subpixels, or another combination, which may be arranged depending on pixel structure designs. However, the invention does not intend to limit the colors respectively corresponding to the first to third subpixels PX1-PX3.

Figure 14A:
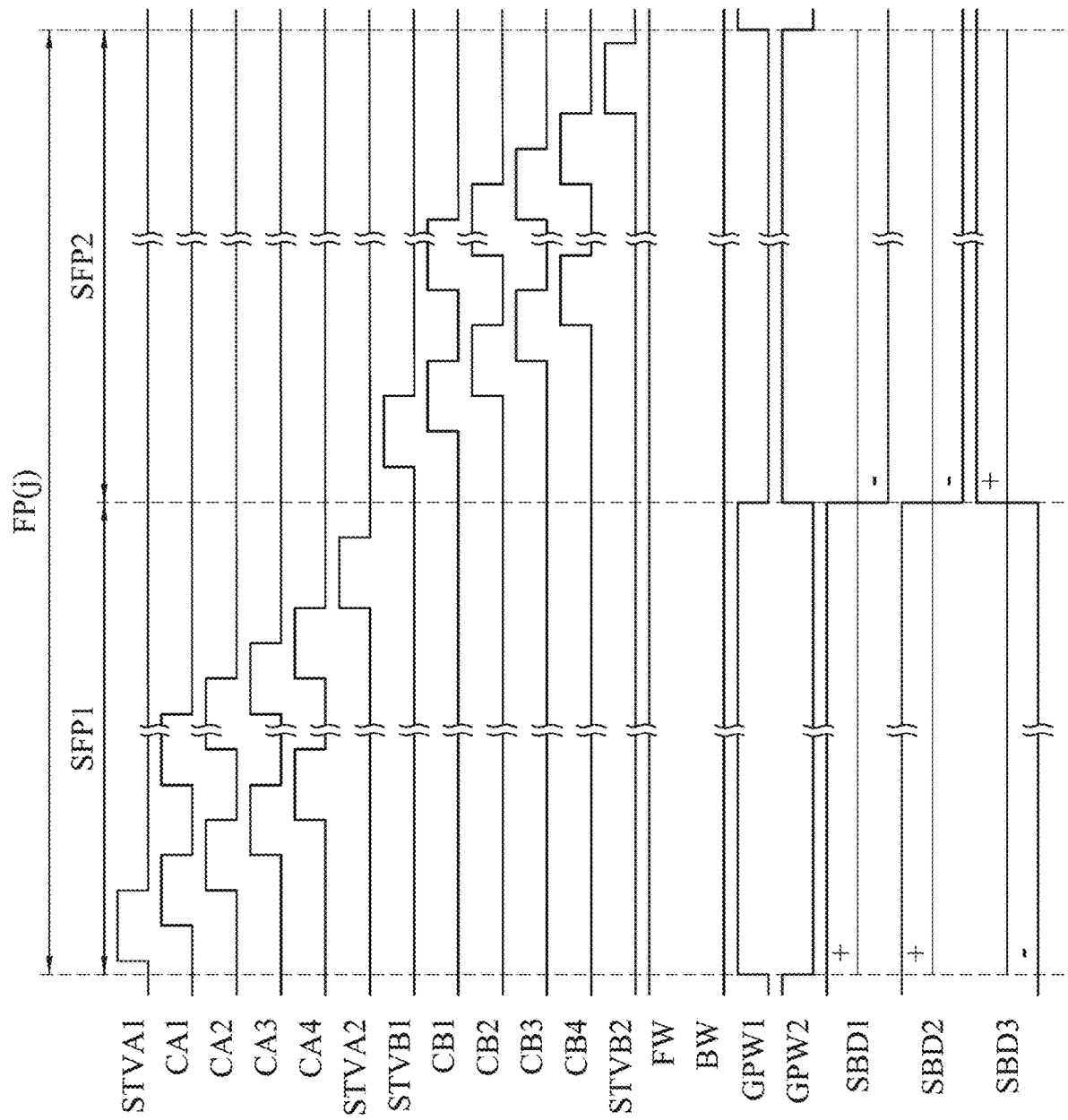
FIG. 14A is a time sequence diagram of the signals and pixel signals of the gate driving circuits in FIGS. 11A-11B during a $j^{th}$ frame period when performing a color image display test on the display panel with the pixel structure shown in FIG. 3.

FIG. 14A is a time sequence diagram of the first control signals STVA1 and STVB1, the clock signals CA1-CA4, CB1-CB4, the second control signals STVA2 and STVB2, the forward input signal FW, the backward input signal BW, the pull-down control signals GPW1 and GPW2 and the pixel signals SBD1-SBD3 of the gate driving circuits 200A and 200B in FIGS. 11A-11B during the $j^{th}$ frame period FP(j) when performing an image display test on the display panel 110 with the pixel structure shown in FIG. 3. In the following description, the disabling and enabling voltage levels are respectively low and high voltage levels, but the invention is not limited thereto. In another embodiment, the disabling and enabling voltage levels may respectively be high and low voltage levels. During the first subframe period SFP1 of the $j^{th}$ frame period FP(j), the forward input signal FW and the backward input signal BW respectively keep at enabling and disabling voltage levels, the pull-down control signals GPW1 and GPW2 respectively keep at enabling and disabling voltage levels, the polarities of the pixel data of the pixel signals SBD1 and SBD2 are positive, and the polarity of the pixel data of the pixel signal SBD3 is negative; for transmitting the odd stage scan signals SC(1), SC(3), ... , SC(N−1) to the odd-numbered scan lines SL(1), SL(3), ... , SL(N−1), at first the first control signal STVA1 switches to the enabling voltage level, and then the clock signals CA1-CA4 sequentially and alternately switch to the enabling voltage level, so as to sequentially output the odd stage scan signals SC(1), SC(3), ... ; SC(N−1) to the odd-numbered scan lines SL(1), SL(3), ... , SL(N−1), such that the pixel data of positive polarity in the pixel signal SBD1 are transmitted into the first subpixels PX1 in the odd-numbered rows of pixel units PX through the first group of data lines DLA, the pixel data of positive polarity in the pixel signal SBD2 are transmitted into the second subpixels PX2 in the odd-numbered rows of pixel units PX through the second group of data lines DLB, the pixel data of negative polarity in the pixel signal SBD3 are transmitted into the third subpixels PX3 in the odd-numbered rows of pixel units PX through the third group of data lines DLC, and at last the second control signal STVA2 switches to the enabling voltage level to end the first subframe period SFP1.

During the second subframe period SFP2 of the $j^{th}$ frame period FP(j), the forward input signal FW and the backward input signal BW respectively keep at enabling and disabling voltage levels, the pull-down control signals GPW1 and GPW2 respectively keep at disabling and enabling voltage levels, the polarities of the pixel data of the pixel signals SBD1 and SBD2 are negative, and the polarity of the pixel data of the pixel signal SBD3 is positive; for transmitting the even stage scan signals SC(2), SC(4), ... , SC(N) to the even-numbered scan lines SL(2), SL(4), ... , SL(N), at first the first control signal STVB1 switches to the enabling voltage level, and then the clock signals CB1-CB4 sequentially and alternately switch to the enabling voltage level, so as to sequentially output the even stage scan signals SC(2), SC(4), ... , SC(N) to the even-numbered scan lines SL(2), SL(4), ... , SL(N), such that the pixel data of negative polarity in the pixel signal SBD1 are transmitted into the first subpixels PX1 in the even-numbered rows of pixel units PX through the first group of data lines DLA, the pixel data of negative polarity in the pixel signal SBD2 are transmitted into the second subpixels PX2 in the even-numbered rows of pixel units PX through the second group of data lines DLB, the pixel data of positive polarity in the pixel signal SBD3 are transmitted into the third subpixels PX3 in the even-numbered rows of pixel units PX through the third group of data lines DLC, and at last the second control signal STVB2 switches to the enabling voltage level to end the second subframe period SFP2.

Figure 14B:
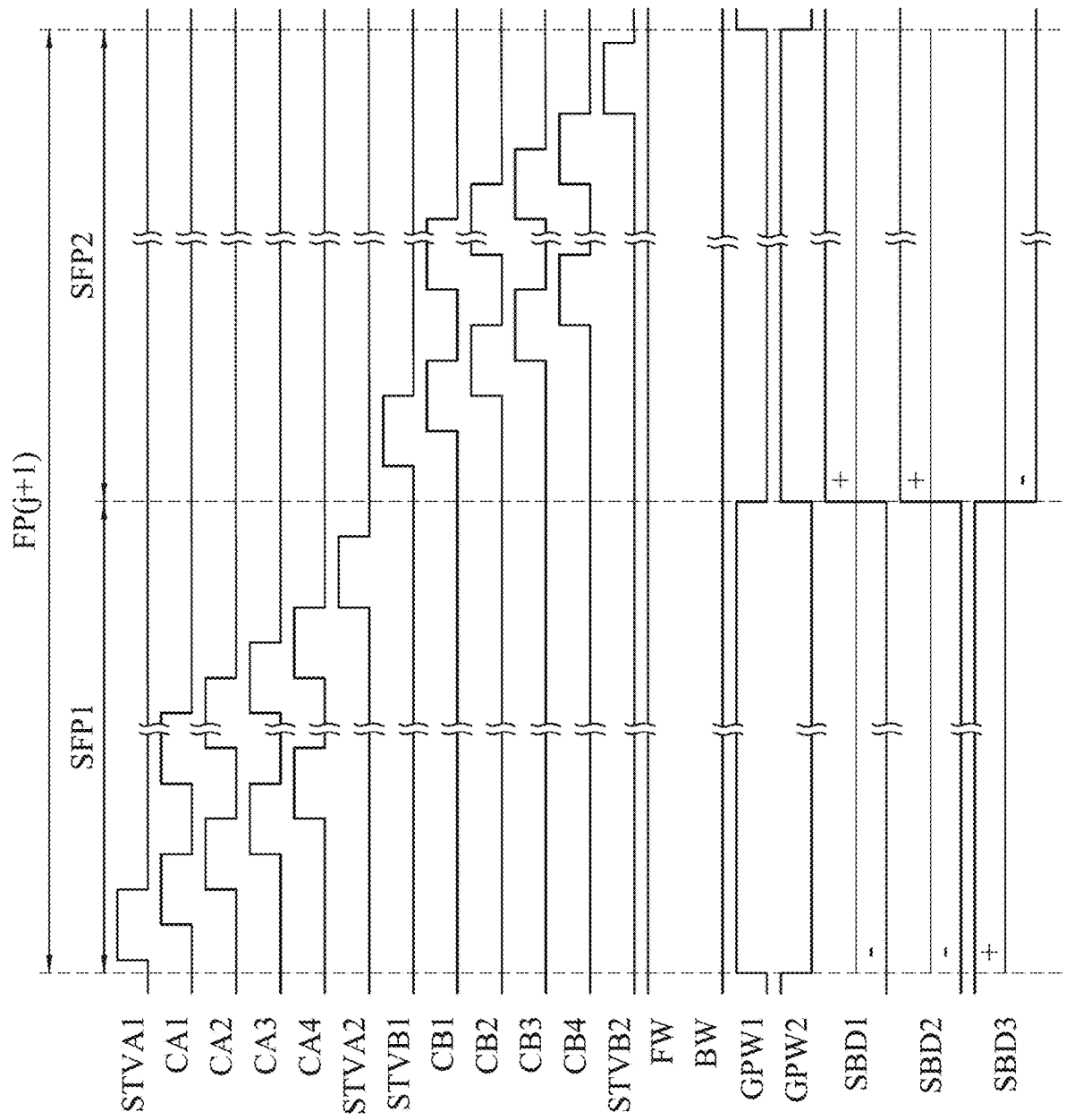
FIG. 14B is a time sequence diagram of the signals and pixel signals of the gate driving circuits in FIGS. 11A-11B during a $(j+1)^{th}$ frame period FP(j+1) when performing a color image display test on the display panel with the pixel structure shown in FIG. 3.

FIG. 14B is a time sequence diagram of the first control signals STVA1, STVB1, the clock signals CA1-CA4, CB1-CB4, the second control signals STVA2 and STVB2, the forward input signal FW, the backward input signal BW, the pull-down control signal GPW1 and GPW2 and the pixel signals SBD1-SBD3 of the gate driving circuits 200A and 200B in FIGS. 11A-11B during the $(j+1)^{th}$ frame period FP(j+1) when performing an image display test on the display panel 110 with the pixel structure shown in FIG. 3. The $j^{th}$ frame period FP(j) and the $(j+1)^{th}$ frame period FP(j+1) are consecutive, and the $(j+1)^{th}$ frame period FP(j+1) is subsequent to the $j^{th}$ frame period FP(j). The time sequences of the first control signals STVA1 and STVB1, the clock signals CA1-CA4 and CB1-CB4, the second control signals STVA2 and STVB2, the forward input signal FW, the backward input signal BW and the pull-down control signal GPW1 and GPW2 are respectively the same as those of the corresponding signals shown in FIG. 14A, and the description thereof is not repeated. The time sequences of the pixel signals SBD1-SBD3 in the first and second subframe periods SFP1 and SFP2 of the $(j−1)^{th}$ frame period FP(j+1) are described in the following.

During the first subframe period SFP1 of the $(j+1)^{th}$ frame period FP(j+1), the polarities of the pixel data of the pixel signals SBD1, SBD2 are negative, and the polarity of the pixel data of the pixel signal SBD3 is positive. The scan signals SC(1), SC(3), ... , SC(N−1) are sequentially outputted to the scan lines SL(1), SL(3), ... , SL(N−1), such that the pixel data of negative polarity in the pixel signal SBD1 are transmitted into the first subpixels PX1 in the odd-numbered rows of pixel units PX through the first group of data lines DLA, the pixel data of negative polarity in the pixel signal SBD2 are transmitted into the second subpixels PX2 in the odd-numbered rows of pixel units PX through the second group of data lines DLB, and the pixel data of positive polarity in the pixel signal SBD3 are transmitted into the third subpixels PX3 in the odd-numbered rows of pixel units PX through the third group of data lines DLC.

During the second subframe period SFP2 of the $(j+1)^{th}$ frame period FP(j+1), the polarities of the pixel data of the pixel signals SBD1, SBD2 are positive, and the polarity of the pixel data of the pixel signal SBD3 is negative. The scan signals SC(2), SC(4), ... , SC(N) are outputted to the scan lines SL(2), SL(4), ... , SL(N) in sequence, such that the pixel data of positive polarity in the pixel signal SBD1 are transmitted into the first subpixels PX1 in the even-numbered rows of pixel units PX through the first group of data lines DLA, the pixel data of positive polarity in the pixel signal SBD2 are transmitted into the second subpixels PX2 in the even-numbered rows of pixel units PX through the second group of data lines DLB, and the pixel data of negative polarity in the pixel signal SBD3 are transmitted into the third subpixels PX3 in the even-numbered rows of pixel units PX through the third group of data lines DLC.

In an embodiment where the touch sensing electrode SP corresponds to 40×48 pixel units PX (i.e. the touch sensing electrode SP is overlapped with areas of 40×48 pixel units PX in a direction perpendicular to the substrate 112) and each of the 40×48 pixel units PX includes three subpixels, during the first subframe period SFP1 of the $j^{th}$ frame FP(j), the first to third subpixels PX1-PX3 in the odd-numbered rows of pixel units PX respectively receive the pixel signal SBD1 of positive polarity, the pixel signal SBD2 of positive polarity and the pixel signal SBD3 of negative polarity, the number of pixel units PX in the odd-numbered rows of pixel units PX is a half of the number of all pixel units PX in the touch display panel, and each pixel unit includes 3 subpixels, such that the number of positive polarity subpixels(i.e. the first and second subpixels PX1, PX2) in a half of the 40×48 pixel units PX is ((40×48)/2)×2=1920, and the number of negative polarity subpixels (i.e. the third subpixels PX3) in the half of the 40×48 pixel units PX is ((40×48)/2)×1=960, and therefore the polarity number difference (which equals to the number of positive polarity subpixels minus the number of negative polarity subpixels in an area of one touch sensing electrode) is 960; during the second subframe SFP2 of the $j^{th}$ frame period FP(j), the first to third subpixels PX1-PX3 in the even-numbered rows of pixel units PX respectively receive the pixel signal SBD1 of negative polarity, the pixel signal SBD2 of negative polarity and the pixel signal SBD3 of positive polarity, the number of pixel units PX in the even-numbered rows of pixel units PX is the other half of the number of all pixel units PX in the touch display panel, and each pixel unit includes 3 subpixels, such that the number of positive polarity subpixels (i.e. the third subpixels PX3) in the other half of the 40×48 pixel units PX is ((40×48)/2)×1=960, and the number of negative polarity subpixels (i.e. the first and second subpixels PX1, PX2) in the other half of the 40×48 pixel units PX is ((40×48)/2)×2=1920, and therefore the polarity number difference is −960. As such, during the $j^{th}$ frame period FP(j), the sum of the polarity number differences respectively in the subframes SFP1 and SFP2 is 960+(−960)=0, which may keep the voltage level of the common voltage of the touch sensing electrodes SP stable.

Similarly, during the first subframe SFP1 or the $(j+1)^{th}$ frame FP(j+1), the first to third subpixels PX1-PX3 in the odd-numbered rows of pixel units PX respectively receive the pixel signal SBD1 of negative polarity, the pixel signal SBD2 of negative polarity and the pixel signal SBD3 of positive polarity. Therefore, the number of subpixels of positive polarity (i.e. the third subpixels PX3) in a half of the 40×48 pixel units PX is ((40×48)/2)×1=960, and the number of subpixels of negative polarity (i.e. the first and second subpixels PX1, PX2) in the half of the 40×48 pixel units PX is ((40×48)/2)×2=1920, such that the polarity number difference is −960; during the second subframe SFP2 of the $(j+1)^{th}$ frame FP(j+1), the first to third subpixels PX1-PX3 in the even-numbered rows of pixel units PX respectively receive the pixel signal SBD1 of positive polarity, the pixel signal SBD2 of positive polarity and the pixel signal SBD3 of negative polarity, such that the number of subpixels of positive polarity (i.e. the first and second subpixels PX1, PX2) in the other half of the 40×48 pixel units PX is ((40×48)/2)×2=1920, and the number of subpixels of negative polarity (i.e. the third subpixels PX3) in the other half of the 40×48 pixel units PX is ((40×48)/2)×1=960, and therefore the polarity number difference is 960. As such, during the $(j+1)^{th}$ frame period FP(j+1), the sum of the polarity number differences respectively in the subframe periods SFP1 and SFP2 is (−960)+960=0, which may keep the voltage level of the common voltage of the touch sensing electrodes SP stable. In addition, because the polarities of each of the pixel signals SBD1-SBD3 respectively in the $j^{th}$ and $(j+1)^{th}$ frame periods FP(j), FP(j+1) are opposite, which achieves the effect of polarity inversion.

It is noted that in FIGS. 14A-14B, voltage levels of the forward input signal FW and the backward input signal BW respectively keep at the enabling and disabling voltage levels during the $j^{th}$ and $(j+1)^{th}$ frame periods FP(j), FP(j+1) for forward scanning. However, the invention is not limited thereto. In another embodiment, voltage levels of the forward input signal FW and the backward input signal BW may respectively keep at the disabling and enabling voltage levels for backward scanning. In addition, in the invention, voltage levels of one and the other of the pull-down control signals GPW1 and GPW2 may respectively be the enabling voltage level and the disabling voltage level during the image display period. As shown in FIGS. 14A-14B, the pull-down control signal GPW1 has a disabling voltage level during the first subframe SFP1 of the $j^{th}$ frame FP(j), an enabling voltage level during the second subframe SFP2 of the $j^{th}$ frame FP(j), a disabling voltage level during the first subframe SFP1 of the $(j+1)^{th}$ frame FP(j+1) and an enabling voltage level during the second subframe SFP2 of the $(j+1)^{th}$ frame FP(j+1), while the pull-down control signal GPW2 has an enabling voltage level during the first subframe SFP1 of the $j^{th}$ frame FP(j), a disabling voltage level during the second subframe SFP2 of the $j^{th}$ frame FP(j), an enabling voltage level during the first subframe SFP1 of the $(j+1)^{th}$ frame FP(j+1) and a disabling voltage level during the second subframe SFP2 of the $(j+1)^{th}$ frame FP(j+1). However, the invention is not limited thereto. In the invention, the pull-down control signals GPW1, GPW2 are phase-inverted during the display period of the touch display panel, and therefore, one and the other of the pull-down control signals GPW1, GPW2 may has the enabling voltage level and the disabling voltage level during each of the first and second subframe periods SFP1, SFP2 of the $j^{th}$ and $(j+1)^{th}$ frame periods FP(j), FP(j+1).

As can be seen from the above description, by implementing the method for testing a touch display panel according to the invention, the sum of the polarity number differences respectively in the subframe periods of each frame period can be 0 for each touch sensing electrode SP corresponding to multiple subpixels, and therefore the voltage level of the touch sensing electrode SP keep at the common voltage during an image display test on the touch display panel, which avoids image display problems (e.g. the roller shutter effect) due to the shift of the voltage level of the touch sensing electrode SP, thereby improving test accuracy.

Figure 15:
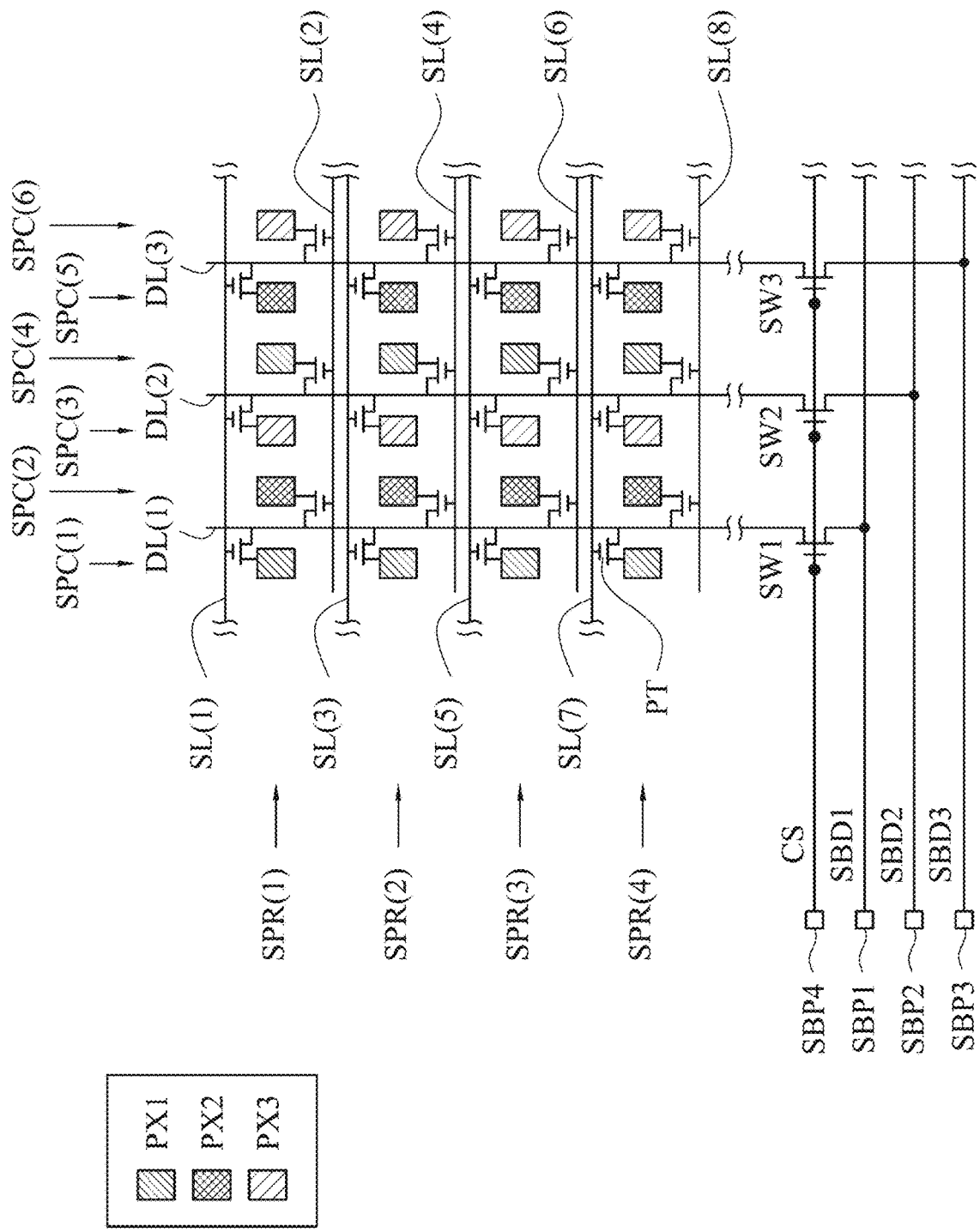
FIG. 15 is an exemplary example of a pixel structure in an active area of the display panel in FIG. 1.

FIG. 15 is another example of the pixel structure in the active area AA of the display panel 110 in FIG. 1. The pixel structure shown in FIG. 15 is a dual-gate pixel structure, in which the $m^{th}$ data line DL(m) is disposed between the $(2m-1)^{th}$ and $(2m)^{th}$ columns of subpixels SPC(2m−1), SPC(2m) and is coupled to the thin film transistors PT in the $(2m-1)^{th}$ and $(2m)^{th}$ columns of subpixels SPC(2m−1), SPC(2m) (the first and second subpixels PX1, PX2, or the second and third subpixels PX2, PX3, or the first and third subpixels PX1 PX3), where m is an integer less than or equal to M. For example, the first data line DL(1) is disposed between the first and second columns of subpixels SPC(1), SPC(2) and is coupled to the thin film transistors PT of the first subpixels PX1 of the first column of subpixels SPC(1) and the thin film transistors PT of the second subpixels PX2 of the second column of subpixels SPC(2); the second data line DL(2) is disposed between the third and fourth columns of subpixels SPC(3), SPC(4) and is coupled to the thin film transistors PT of the third subpixels PX3 of the third column of subpixels SPC(3) and the thin film transistors PT of the first subpixels PX1 of the fourth column of subpixels SPC(4); and the third data line DL(3) is disposed between the fifth and sixth columns of subpixels SPC(5), SPC(6) and is coupled to the thin film transistors PT of the second subpixels PX2 of the fifth column of subpixels SPC(5) and the thin film transistors PT of the third subpixels PX3 of the sixth column of subpixels SPC(6); the $(n/2)^{th}$ row of subpixels SPR(n/2) are disposed between the $(n-1)^{th}$ and $n^{th}$ scan lines SL(n−1), SL(n), in which some of the subpixels of the $(n/2)^{th}$ row of subpixels SPR(n/2) are coupled to the $(n-1)^{th}$ scan lines SL(n−1), and others of the subpixels of the $(n/2)^{th}$ row of subpixels SPR(n/2) are coupled to the $n^{th}$ scan lines SL(n), where n is an even number less than or equal to N. For example, the first row of subpixels SPR(1) are disposed between the first and second scan lines SL(1), SL(2), some of the subpixels of the first row of subpixels SPR(1) are coupled to the first scan lines SL(1), others of the subpixels of the first row of subpixels SPR(1) are coupled to the second scan lines SL(2); the second row of subpixels SPR(2) are disposed between the third and fourth scan lines SL(3), SL(4), some of the subpixels of the second row of subpixels SPR(2) are coupled to the third scan lines SL(3), others of the subpixels of the second row of subpixels SPR(2) are coupled to the fourth scan lines SL(4). For each subpixel, when the scan signal provided by the corresponding scan line switches to the enabling voltage level, the pixel signal provided by the corresponding data line is transmitted to the pixel electrode through the thin film transistor PT. In comparison with the pixel structure in FIG. 3, the pixel structure in FIG. 15 has 2M number of columns of subpixels and (N/2) number of rows of subpixels, i.e. 2M×(N/2) subpixels.

When an image display test is performed on the touch display panel 110 with the pixel structure shown in FIG. 15, for example, in an embodiment where the first to third subpixels PX1-PX3 of the display panel 110 luminate to display the image, the timing sequences of the first control signals STVA1 and STVB1, the clock signals C1-C8, the second control signals STVA2 and STVB2, the forward input signal FW, the backward input signal BW, the pull-down control signal GPW1 and GPW2 and the pixel signals SBD1-SBD3 of the gate driving circuits 200A and 200B during the $j^{th}$ and $(j+1)^{th}$ frame periods FP(j), FP(j+1) shown in FIGS. 11A-11B may be the same as those shown in FIGS. 14A-14B, which may also achieve the effect in which the sum of the polarity number differences respectively in the subframe periods of each frame period is 0 for each touch sensing electrode SP corresponding to multiple subpixels.

It is noted that although the display panel 100 in FIG. 1, the single-gate pixel structure in FIG. 3, the corresponding relation between the touch sensing electrode SP and the pixel units PX in FIG. 5, the gate driving circuits 200A, 200B in FIGS. 11A-11B, the signal time sequence chart in FIGS. 14A-14B and the dual-gate pixel structure in FIG. 15 only show some components, structures and waveforms, those who are ordinary skilled in the art can directly know the other components, structures and waveforms not shown in the figures by referencing the contents in the specification. It is noted that the terms "first," "second" and "third" used for the first color, the first subpixels PX1, the first group of data lines DLA, the second color, the second subpixels PX2, the second group of data lines DLB, the third color, the third subpixels PX3, the third group of data lines DLC in the context are only used to distinguish from different colors, different subpixels for displaying colors and different groups of data lines, but these terms should not be used to limit the scope of claims in the application. For example, in the context, the first subpixels PX1, the second subpixels PX2 and the third subpixels PX3 may also be referred to as a first subpixel PX1, a third subpixel PX2 and a second subpixel PX3 that respectively display a first color, a third color and a second color, the first group of data lines DLA, the second group of data lines DLB and the third group of data lines DLC may also be referred to as the first group of data lines DLA, the third group of data lines DLB and the second group of data lines DLC, but the invention is not limited thereto.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for displaying an image on a touch display panel, the touch display panel comprising a substrate and a plurality of scan lines, a plurality of data lines, a plurality of first thin film transistors, a plurality of second thin film transistors, a plurality of third thin film transistors, a first test pad, a second test pad, a third test pad and a plurality of subpixels disposed on the substrate, each of the subpixels being electrically connected to a corresponding one of the scan lines, the scan lines comprising $1^{st}$ to $N^{th}$ scan lines, N is an even integer, the $1^{st}$ to $N^{th}$ scan lines being sequentially disposed along a direction, the scan lines, the data lines and the subpixels being disposed in an active area of the touch display panel, the first thin film transistors, the second thin film transistors, the third thin film transistors, the first test pad, the second test pad and the third test pad being disposed in a peripheral area of the touch display panel, the data lines being divided into a first group of data lines, a second group of data lines and a third group of data lines, the subpixels comprising a plurality of first subpixels configured to display a first color, a plurality of second subpixels configured to display a second color and a plurality of third subpixels configured to display a third color, the first color, the second color and the third color being different from each other, each of the first subpixels being electrically connected to a corresponding data line of the first group of data lines, each of the second subpixels being electrically connected to a corresponding data line of the second group of data lines, each of the third subpixels being electrically connected to a corresponding data line of the third group of data lines, each of the first thin film transistors, the second thin film transistors and the third thin film transistors comprising a control terminal, a first terminal and a second terminal, the first terminal of each of the first thin film transistors being electrically connected to a corresponding data line of the first group of data lines, the first terminal of each of the second thin film transistors being electrically connected to a corresponding data line of the second group of data lines, the first terminal of each of the third thin film transistors being electrically connected to a corresponding data line of the third group of data lines, the second terminals of the first thin film transistors being electrically connected to the first test pad, the second terminals of the second thin film transistors being electrically connected to the second test pad, the second terminals of the third thin film transistors being electrically connected to the third test pad, each of the subpixels comprising a pixel electrode and a common electrode, the common electrodes of X number of subpixels being electrically connected to form a touch sensing electrode, X being an integer greater than or equal to 2, and the method comprising:

dividing a frame period of the image into a first subframe period and a second subframe period;

transmitting pixel data to a first portion of the X number of subpixels in the first subframe period, wherein the number of the subpixels receiving pixel data of positive polarity in the first portion of the X number of subpixels subtracted by the number of the subpixels receiving pixel data of negative polarity in the first portion of the X number of subpixels is defined as a first polarity number difference, wherein the first portion of the X number of subpixels comprise a portion of the first subpixels, a portion of the second subpixels and a portion of the third subpixels, each of the portion of the first subpixels in the first portion of the X number of subpixels receives a first pixel signal having pixel data of positive polarity in the first subframe period, each of the portion of the second subpixels in the first portion of the X number of subpixels receives a second pixel signal having pixel data of positive polarity in the first subframe period, and each of the portion of the third subpixels in the first portion of the X number of subpixels receives a third pixel signal having pixel data of negative polarity in the first subframe period, wherein in the first subframe period, an enabling voltage is transmitted to each of the control terminals of the first thin film transistors, the second thin film transistors and the third thin film transistors to turn on each of the first thin film transistors, the second thin film transistors and the third thin film transistors, $(2K-1)^{th}$ scan lines of the $1^{st}$ to $N^{th}$ scan lines are enabled, $(2K)^{th}$ scan lines of the $1^{st}$ to $N^{th}$ scan lines are disabled, K is an integer from 1 to N/2, the pixel data of positive polarity in the first pixel signal are transmitted to the portion of the first subpixels in the first portion of the X number of subpixels through the first test pad, the first thin film transistors which are turned on and the first group of data lines, the pixel data of positive polarity in the second pixel signal are transmitted to the portion of the second subpixels in the first portion of the X number of subpixels through the second test pad, the second thin film transistors which are turned on and the second group of data lines, and the pixel data of negative polarity in the third pixel signal are transmitted to the portion of the third subpixels in the first portion of the X number of subpixels through the third test pad, the third thin film transistors which are turned on and the third group of data lines; and transmitting pixel data to a second portion of the X number of subpixels in the second subframe period, wherein the number of the subpixels receiving pixel data of positive polarity in the second portion of the X number of subpixels subtracted by the number of the subpixels receiving pixel data of negative polarity in the second portion of the X number of subpixels is defined as a second polarity number difference, and the first portion of the X number of subpixels and the second portion of the X number of subpixels are disposed at different locations on the substrate, wherein the second portion of the X number of subpixels comprise another portion of the first subpixels, another portion of the second subpixels and another portion of the third subpixels, each of the another portion of the first subpixels in the second portion of the X number of subpixels receives the first pixel signal having pixel data of negative polarity in the second subframe period, each of the another portion of the second subpixels in the second portion of the X number of subpixels receives the second pixel signal having pixel data of negative polarity in the second subframe period, and each of the another portion of the third subpixels in the second portion of the X number of subpixels receives the third pixel signal having pixel data of positive polarity in the second subframe period, wherein in the second subframe period, the enabling voltage is transmitted to each of the control terminals of the first thin film transistors, the second thin film transistors and the third thin film transistors to turn on each of the first thin film transistors, the second thin film transistors and the third thin film transistors, the $(2K-1)^{th}$ scan lines of the $1^{st}$ to $N^{th}$ scan lines are disabled, the $(2K)^{th}$ scan lines of the $1^{st}$ to $N^{th}$ scan lines are enabled, the pixel data of negative polarity in the first pixel signal are transmitted to the another portion of the first subpixels in the second portion of the X number of subpixels through the first test pad, the first thin film transistors which are turned on and the first group of data lines, the pixel data of negative polarity in the second pixel signal are transmitted to the another portion of the second subpixels in the second portion of the X number of subpixels through the second test pad, the second thin film transistors which are turned on and the second group of data lines, and the pixel data of positive polarity in the third pixel signal are transmitted to the another portion of the third subpixels in the second portion of the X number of subpixels through the third test pad, the third thin film transistors which are turned on and the third group of data lines;

wherein each of the first polarity number difference and the second polarity number difference is non-zero, and a sum of the first polarity number difference and the second polarity number difference is 0.

2. The method of claim 1, wherein the number of subpixels in the first portion of the X number of subpixels is X/2, and the number of subpixels in the second portion of the X number of subpixels is X/2.

3. The method of claim 1, wherein the number of the portion of the first subpixels in the first portion of the X number of subpixels is equal to the number of the another portion of the first subpixels in the second portion of the X number of subpixels.

4. The method of claim 1, further comprising:
dividing another frame period of the image into a third subframe period and a fourth subframe period, wherein the second subframe period is subsequent to the first subframe period, the fourth subframe period is subsequent to the third subframe period;
wherein each of the portion of the first subpixels in the first portion of the X number of subpixels receives the first pixel signal having pixel data of negative polarity in the third subframe period, each of the portion of the second subpixels in the first portion of the X number of subpixels receives the second pixel signal having pixel data of negative polarity in the third subframe period, and each of the portion of the third subpixels in the first portion of the X number of subpixels receives the third pixel signal having pixel data of positive polarity in the third subframe period;
wherein each of the another portion of the first subpixels in the second portion of the X number of subpixels receives the first pixel signal having pixel data of positive polarity in the fourth subframe period, each of the another portion of the second subpixels in the second portion of the X number of subpixels receives the second pixel signal having pixel data of positive polarity in the fourth subframe period, and each of the another portion of the third subpixels in the first portion of the X number of subpixels receives the third pixel signal having pixel data of negative polarity in the fourth subframe period.

5. The method of claim 1, wherein the number of the first subpixels in the X number of subpixels, the number of the second subpixels in the X number of subpixels and the number of the third subpixels in the X number of subpixels are equal to each other, and the number of the first subpixels in the portion of the first subpixels, the number of the second subpixels in the portion of the second subpixels, the number of the third subpixels in the portion of the third subpixels, the number of the first subpixels in the another portion of the first subpixels, the number of the second subpixels in the another portion of the second subpixels, and the number of the third subpixels in the another portion of the third subpixels are equal to each other.

6. The method of claim 5, wherein the number of the first subpixels in the X number of subpixels, the number of the second subpixels in the X number of subpixels and the number of the third subpixels in the X number of subpixels are equal to one-third of X, and the number of the first subpixels in the portion of the first subpixels, the number of the second subpixels in the portion of the second subpixels, the number of the third subpixels in the portion of the third subpixels, the number of the first subpixels in the another portion of the first subpixels, the number of the second subpixels in the another portion of the second subpixels, and the number of the third subpixels in the another portion of the third subpixels are equal to one-sixth of X.

7. The method of claim 1, wherein the data lines data lines are sequentially disposed along a direction, the first group of data lines comprise $(3K-2)^{th}$ data lines, the second group of data lines comprise $(3K-1)^{th}$ data lines, and the third group of data lines comprise $(3K)^{th}$ data lines, wherein K is an integer from 1 to M/3, and M is a positive multiple of 3.

8. The method of claim 1, wherein the touch display panel further comprises a fourth test pad disposed in the peripheral area of the touch display panel, and the control terminals of the first to third thin film transistors are electrically connected to the fourth test pad.

9. The method of claim 1, wherein each of the plurality of subpixels further comprises at least one insulating layer disposed between the pixel electrode and the common electrode, and the pixel electrode is disposed over or below the common electrode in each of the subpixels.

* * * * *